(12) United States Patent
Wariishi

(10) Patent No.: US 7,390,595 B2
(45) Date of Patent: Jun. 24, 2008

(54) METHOD OF PREPARING A CROSSLINKED POLYMER IN AN ELECTROLYTE COMPOSITION

(75) Inventor: Koji Wariishi, Kanagawa (JP)

(73) Assignee: Fujifilm Corporation, Minato-Ku, Tokyo (JP)

( * ) Notice: Subject to any disclaimer, the term of this patent is extended or adjusted under 35 U.S.C. 154(b) by 340 days.

(21) Appl. No.: 10/431,506

(22) Filed: May 8, 2003

(65) Prior Publication Data

US 2003/0219647 A1 Nov. 27, 2003

Related U.S. Application Data

(62) Division of application No. 09/391,511, filed on Sep. 8, 1999, now abandoned.

(30) Foreign Application Priority Data

Sep. 10, 1998 (JP) ................... 10-274425

(51) Int. Cl.
 *H01M 10/22* (2006.01)
(52) U.S. Cl. .................. 429/314; 429/309; 252/62.2
(58) Field of Classification Search ................ 429/314, 429/309; 252/62.2
 See application file for complete search history.

(56) References Cited

U.S. PATENT DOCUMENTS

| 4,014,798 | A | * | 3/1977 | Rembaum ............... 210/500.23 |
| 4,442,185 | A | | 4/1984 | Skotheim |
| 4,644,020 | A | | 2/1987 | Stahl |
| 4,644,037 | A | | 2/1987 | Druy et al. |
| 4,807,977 | A | | 2/1989 | Sammells |
| 4,943,499 | A | | 7/1990 | Casalbore-Miceli et al. |
| 4,992,176 | A | * | 2/1991 | Bartels ................ 210/640 |
| 5,115,057 | A | | 5/1992 | Ono et al. |
| 5,219,679 | A | | 6/1993 | Abraham et al. |
| 5,232,795 | A | | 8/1993 | Simon et al. |
| 5,290,644 | A | | 3/1994 | Andrieu |
| 5,296,318 | A | | 3/1994 | Gozdz et al. |
| 5,569,560 | A | | 10/1996 | Olsen et al. |
| 5,643,490 | A | | 7/1997 | Takahashi et al. |
| 5,688,614 | A | * | 11/1997 | Li et al. .................. 429/310 |
| 5,965,300 | A | | 10/1999 | Lee et al. |
| 6,258,276 | B1 | | 7/2001 | Mika et al. |

FOREIGN PATENT DOCUMENTS

| DE | 93 12 084.2 | | 8/1994 |
| EP | 3447463 | * | 1/1986 |
| EP | 0 470 699 A1 | | 2/1992 |
| EP | 470699 | * | 2/1992 |
| EP | 0 911 841 A2 | | 4/1999 |
| JP | 4-073803 A | | 3/1992 |
| JP | 06-251776 | * | 9/1994 |
| JP | 06-251776 A | | 9/1994 |
| JP | 10-003944 A | | 1/1998 |
| WO | 95/18456 A1 | | 7/1995 |

* cited by examiner

*Primary Examiner*—Mark Ruthkosky
(74) *Attorney, Agent, or Firm*—Buchanan Ingersoll & Rooney PC

(57) ABSTRACT

A crosslinked polymer obtained by allowing a polyfunctional electrophilic reagent to react on a nitrogen-containing polymer, an electrolyte containing the crosslinked polymer, and a photo-electrochemical cell having an electrically conductive substrate, a semiconductor layer, an electrolyte layer containing the electrolyte, and a counter electrode. The cell is excellent in photoelectric characteristics and durability.

4 Claims, 1 Drawing Sheet

METHOD OF PREPARING A CROSSLINKED POLYMER IN AN ELECTROLYTE COMPOSITION

This application is a divisional of application Ser. No. 09/391,511, filed on Sep. 8, 1999 now abandoned.

FIELD OF THE INVENTION

This invention relates to a crosslinked polymer useful as a material of an electrolyte that can be used in electrochemical devices, such as cells, capacitors, sensors, displays, and recording devices; a novel electrolyte containing the polymer; and a photo-electrochemical cell (sometimes, called photoelectric conversion device) comprising the electrolyte and a semiconductor.

BACKGROUND OF THE INVENTION

A liquid electrolyte (i.e., an electrolytic solution) has been used in electrochemical devices such as cells, capacitors, sensors, displays and recording devices. However, a liquid electrolyte lacks reliability in long-term use or storage because of a fear of a leak.

*Nature*, vol. 353, pp. 737-740 (1991) and U.S. Pat. No. 4,927,721 disclose a photoelectric conversion device comprising a dye-sensitized particulate semiconductor and a photo-electrochemical cell having the device. In this technique, too, a liquid electrolyte is used as a positive hole transporting layer, and there is a fear that the device will be short of the electrolytic solution due to evaporation in long-term use only to have a seriously deteriorated photoelectric conversion efficiency or fail to function as a device.

In order to overcome this disadvantage, WO93/20565 proposes a photoelectric conversion device comprising a solid electrolyte, and JP-A-7-288142 (the term "JP-A" as used herein means an "unexamined published Japanese patent application"), *Solid State Ionics*, vol. 89, p. 263 (1986), and JP-A-9-27352 teach a photoelectric conversion device having a solid electrolyte containing a crosslinked polyethylene oxide derivative. However, it turned out as a result of study that the photoelectric conversion devices using these solid electrolytes are insufficient in photoelectric conversion characteristics, particularly in short circuit current density, and their durability are also insufficient.

SUMMARY OF THE INVENTION

An object of the present invention is to provide a crosslinked polymer useful as a material of an electrolyte and a novel electrolyte [including a solid electrolyte and a liquid electrolyte (i.e., an electrolytic solution)] containing the same.

Another object of the present invention is to provide a photo-electrochemical cell which is a photoelectric conversion device excellent in photoelectric conversion characteristics and durability.

As a result of extensive investigation, the inventors of the present invention have found that the above objects are accomplished by:

(1) a crosslinked polymer obtained by allowing an electrophilic reagent having bi- or higher functionality to react on a nitrogen-containing polymer,
(2) an electrolyte containing the crosslinked polymer in the above item (1), and
(3) a photo-electrochemical cell having an electrically conductive substrate, a semiconductor layer that is provided on the substrate, an electrolyte layer, and a counter electrode, wherein the electrolyte layer comprises the electrolyte in the above item (2).

The present invention provides a novel crosslinked polymer useful as a material of an electrolyte, a novel electrolyte, and a photo-electrochemical cell excellent in photoelectric conversion characteristics and durability.

DETAILED DESCRIPTION OF THE INVENTION

Figure 1:
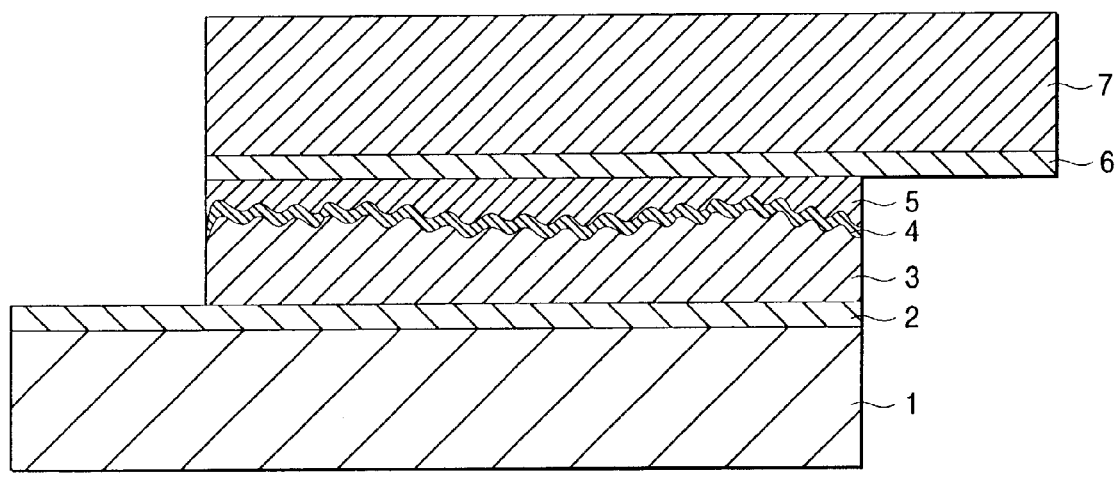
FIG. 1 is a schematic cross section of the photo-electrochemical cell prepared in Examples.

The photo-electrochemical cell of the invention is characterized by using, as an electrolyte component, a crosslinked polymer that is easily obtained by the reaction between a nitrogen-containing polymer and an electrophilic reagent for the nitrogen atom of the polymer. This characteristic secures superiority of the cell in photoelectric conversion characteristics and inhibits deterioration of the photoelectric conversion characteristics with time. To the contrary, where a conventional liquid electrolyte containing a solvent, such as acetonitrile, is used, the cell undergoes considerable deterioration in the photoelectric conversion characteristics with time. Where known crosslinked polymers, e.g., the polyethylene oxide derivative as described in JP-A-9-27352, is used, the cell has deteriorated photoelectric characteristics and, moreover, undergoes appreciable deterioration in the characteristics with time.

In saying "the nitrogen atom in the nitrogen-containing polymer", the term "nitrogen atom" means the one that can be alkylated or quaternized with an electrophilic reagent. Such a nitrogen atom may be on either of the main chain or the side chain of the polymer but is preferably on the side chain.

The nitrogen-containing polymer which can be used in the invention is preferably a compound having a repeating unit represented by formula (I-a):

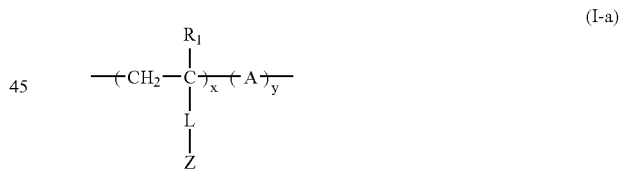

wherein $R_1$ represents a hydrogen atom or an alkyl group having 1 to 4 carbon atoms; Z represents a nitrogen-containing heterocyclic group; L represents a single bond or a divalent linking group; A represents a repeating unit derived from a compound having an ethylenically unsaturated group; and x and y each represent a molar ratio of the respective repeating units, x being 5 to 100 mol %, and y being 0 to 95 mol %.

$R_1$ is preferably a hydrogen atom or a methyl group.

The nitrogen-containing heterocyclic ring in the group represented by Z may be saturated or unsaturated and may contain other hetero atoms other than the nitrogen atom. Examples of the unsaturated heterocyclic ring includes pyridine, imidazole, thiazole, oxazole and triazole rings. Examples of the saturated heterocyclic ring includes morpholine, piperidine and piperazine rings. The unsaturated heterocyclic rings are preferred, with a pyridine or imidazole ring being more preferred. The nitrogen-containing heterocyclic ring is preferably unsubstituted but may be substituted with, for example, an alkyl group (e.g., methyl).

The linking group represented by L can be any divalent linking group having at least one atom selected from the group consisting of C, O, N, and S. Preferred linking groups are —COO—, —OCO—, —CON($R_6$)— or —N ($R_7$) CO, and a combination of one or more of these groups and one or more divalent groups selected from the group consisting of an alkylene group, an arylene group and —O—, wherein $R_6$ and $R_7$ each represent a hydrogen atom or a lower alkyl group, preferably a hydrogen atom or an alkyl group having 1 to 6 carbon atoms. The alkylene or arylene group may have a substituent(s), such as a halogen atom (e.g., fluorine, chlorine, bromine or iodine), a hydroxyl group, an amino group, a nitro group, a carboxyl group, a carbamoyl group, a sulfonic group, a sulfonamido group, an acyl group (e.g., formyl or acetyl), an acyloxy group, an acylamino group (e.g., acetamido or benzamido), an alkyl group, an alkoxy group (e.g., methoxy, ethoxy or methoxyethoxy), an alkoxycarbonyl group, an alkylsulfonyl group, an aryl group, an aryloxy group (e.g., phenoxy), and an arylsulfonyl group.

Particularly preferred as a linking group L are —COO—, —COO—$(CH_2CH_2O)_n$— (n: an integer of 1 to 30), —COO—$(C_3H_6O)_n$— (n: an integer of 1 to 30), —COO—$(CH_2)_n$— (n: an integer of 1 to 10), —COO—$(CH_2)_n$—OCO— (n: an integer of 1 to 10), —COO—$(CH_2)_m$—OCO—$(CH_2)_n$— (m, n: an integer of 1 to 10), —COO—$(CH_2CH_2O)_n$—CO— (n: an integer of 1 to 30), —COO—$(CH_2CH_2O)_m$—CO—$(CH_2)_n$— (m: an integer of 1 to 30; n: an integer of 1 to 10), —COO—$(C_3H_6)_n$—CO— (n: an integer of 1 to 30), —COO—$(C_3H_6)_m$—CO—$(CH_2)_n$— (m: an integer of 1 to 30; n: an integer of 1 to 10), —CONH—, —CON($CH_3$)—, —CONH—$(CH_2)_n$— (n: an integer of 1 to 10), —CONH—$(CH_2)_9$—O—$(CH_2CH_2O)_n$—$(CH_2)_3$—NHCO— (n: an integer of 1 to 30), —CONH—$C_3H_6$—O—$(CH_2CH_2O)_n$—$C_3H_6$—NHCO— (n: an integer of 1 to 30), —CONH—$C_3H_6$—O—$(C_3H_6O)_n$—$C_3H_6$—NHCO— (n: an integer of 1 to 30), —COO—$(CH_2)_n$—O—COO— (n: an integer of 1 to 10), —COO—$(CH_2)_n$—NHCO— (n: an integer of 1 to 10), —OCO—, —OCO—$(CH_2)_n$— (n: an integer of 1 to 10), —O—COO—$(CH_2)_n$— (n: an integer of 1 to 10), —NHCO—$(CH_2)_n$— (n: an integer of 1 to 10), —NHCO—$(CH_2)_n$—CONH— (n: an integer of 1 to 10), —NHCO—$(CH_2)_m$—CONH—$(CH_2)_n$— (m, n: an integer of 1 to 10) and —NHCO—O—$(CH_2)_n$—OCO— (n: an integer of 1 to 10).

A molar ratio (x) of the repeating unit containing Z in the nitrogen-containing polymer of formula (I-a) ranges from 5 to 100 mol %, preferably from 10 to 95 mol %. The polymer may have a combination of the Z-containing repeating units having different nitrogen-containing hetero rings.

Examples of compounds having an ethylenically unsaturated group (hereinafter referred to as an ethylenically unsaturated compound) from which the repeating unit A is derived preferably include esters or amides of acrylic acid or α-alkylacrylic acids (e.g., methacrylic acid), such as N-isopropylacrylamide, N-n-butylacrylamide, N-t-butylacrylamide, N,N-dimethylacrylamide, N-methylmethacrylamide, acrylamide, 2-acrylamido-2-methylpropanesulfonic acid, acrylamidopropyltrimethylammonium chloride, methacrylamide, diacetoneacrylamide, N-methylolacrylamide, N-methylolmethacrylamide, N-acrylmorpholine, methyl acrylate, ethyl acrylate, hydroxyethyl acrylate, n-propyl acrylate, isopropyl acrylate, 2-hydroxypropyl acrylate, 2-methyl-2-nitropropyl acrylate, n-butyl acrylate, isobutyl acrylate, t-butyl acrylate, t-pentyl acrylate, 2-methoxyethyl acrylate, 2-ethoxyethyl acrylate, 2-methoxyethoxyethyl acrylate, 2,2,2-trifluoroethyl acrylate, 2,2-dimethylbutyl acrylate, 3-methoxybutyl acrylate, ethylcarbitol acrylate, phenoxyethyl acrylate, n-pentyl acrylate, 3-pentyl acrylate, octafluoropentyl acrylate, n-hexyl acrylate, cyclohexyl acrylate, cyclopentyl acrylate, cetyl acrylate, benzyl acrylate, n-octyl acrylate, 2-ethyihexyl acrylate, 4-methyl-2propylpentyl acrylate, heptadecafluorodecyl acrylate, n-octadecyl acrylate, methyl methacrylate, 2-methoxyethoxyethyl methacrylate, 2-(ethoxycarbonyloxy)ethyl methacrylate, 2,2,2-trifluoroethyl methacrylate, tetrafluoropropyl methacrylate, hexafluoropropyl methacrylate, hydroxyethyl methacrylate, 2-hydroxypropyl methacrylate, n-butyl methacrylate, isobutyl methacrylate, t-butyl methacrylate, t-pentyl methacrylate, 2-methoxyethyl methacrylate, 2-ethoxyethyl methacrylate, benzyl methacrylate, heptadecafluorodecyl methacrylate, n-octadecyl methacrylate, 2-isobornyl methacrylate, 2-norbornylmethyl methacrylate, 5-norbornen-2-ylmethyl methacrylate, 3-methyl-2-norbonylmethyl methacrylate, and dimethylaminoethyl methacrylate; acrylic acid or α-alkylacrylic acids, such as methacrylic acid and itaconic acid; vinyl esters, such as vinyl acetate; maleic acid or fumaric acid esters, such as dimethyl maleate, dibutyl maleate, and diethyl fumarate; maleic acid, fumaric acid, sodium salts of p-styrene sulfonic acid, acrylonitrile, methacrylonitrile; dienes, such as butadiene, cyclopentadiene and isoprene; aromatic vinyl compounds, such as styrene, p-chlorostyrene, t-butylstyrene, α-methylstyrene, sodium styrenesulfonate, and 1-(4-methoxymethylphenyl)ethylene; N-vinylformamide, N-vinyl-N-methylformamide, N-vinylacetamide, N-vinyl-N-methylacetamide, vinylsulfonic acid, sodium vinyl-sulfonate, sodium allysulfonate, sodium methallysulfonate, vinylidene fluoride, vinylidene chloride, vinyl alkyl ethers (e.g., methyl vinyl ether), ethylene, propylene, 1-butene, isobutene, N-phenylmaleimide, and vinylpyrrolidone. These ethylenically unsaturated compounds can be used either individually or as a combination thereof. Other useful ethylenically unsaturated compounds are described in Research Disclosure No. 1955 (July, 1980). The molar ratio of the repeating unit A in the nitrogen-containing polymer ranges from 0 to 95 mol %, preferably 5 to 90 mol %.

The nitrogen-containing polymer preferably has a weight average molecular weight of 1,000 to 1,000,000, particularly 2,000 to 100,000.

The nitrogen-containing polymer is preferably used in an amount of 1 to 80% by weight, particularly 3 to 70% by weight, based on the electrolyte solution which is preferably used in preparing the electrolyte of the invention. The nitrogen-containing polymers can be used either individually or as a combination of two or more thereof.

Specific but non-limiting examples of the N-containing polymers that are preferably used in the invention are shown below.

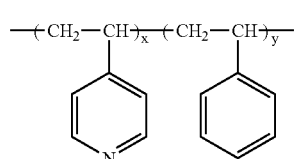

1-1 x/y = 70/30

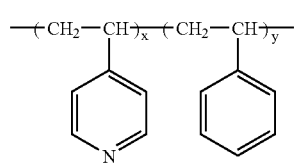

1-2 x/y = 50/50

-continued
1-3
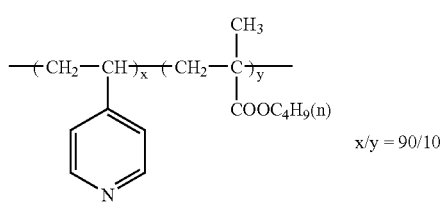
x/y = 90/10
1-4
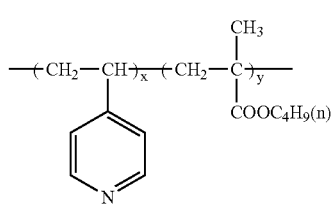
x/y = 70/30
1-5
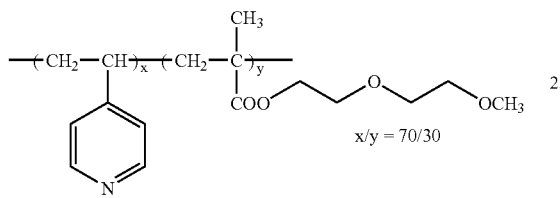
x/y = 70/30
1-6
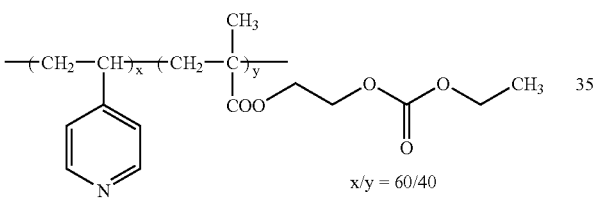
x/y = 60/40
1-7
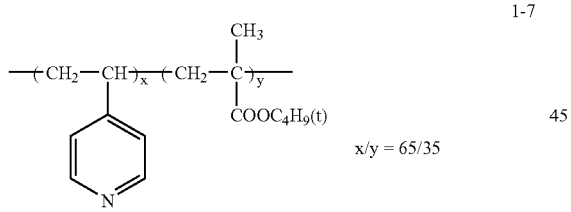
x/y = 65/35
1-8
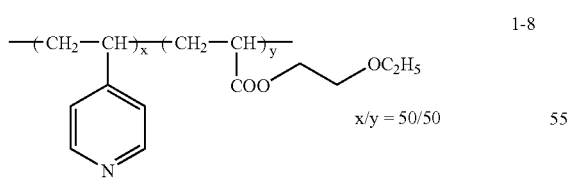
x/y = 50/50
1-9
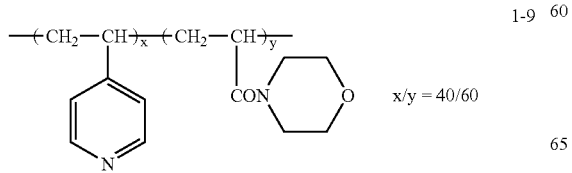
x/y = 40/60
-continued
1-10
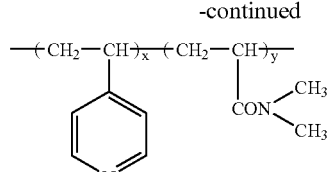
x/y = 30/70
1-11
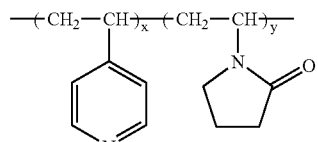
x/y = 45/55
1-12
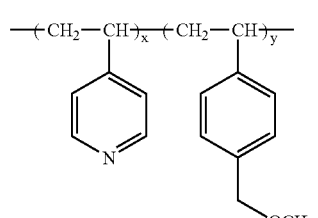
x/y = 70/30
1-13
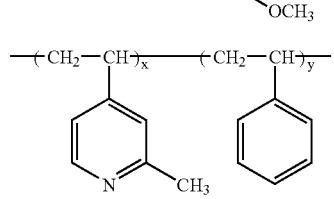
x/y = 70/30
1-14
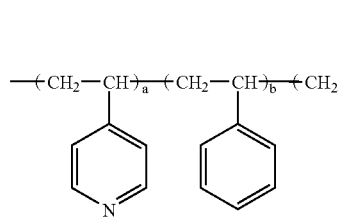
a/b/c = 70/20/10
1-15
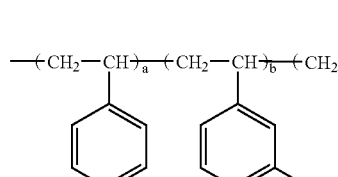
a/b/c = 30/30/40
1-16
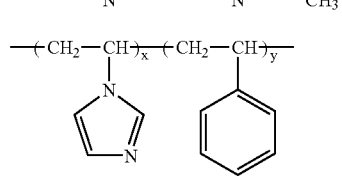
x/y = 20/80
1-17
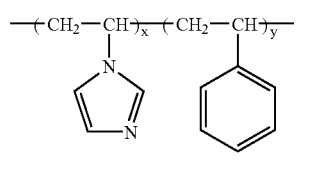
x/y = 10/90
1-18
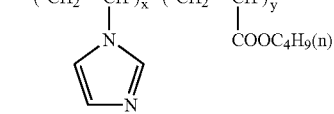
x/y = 30/70

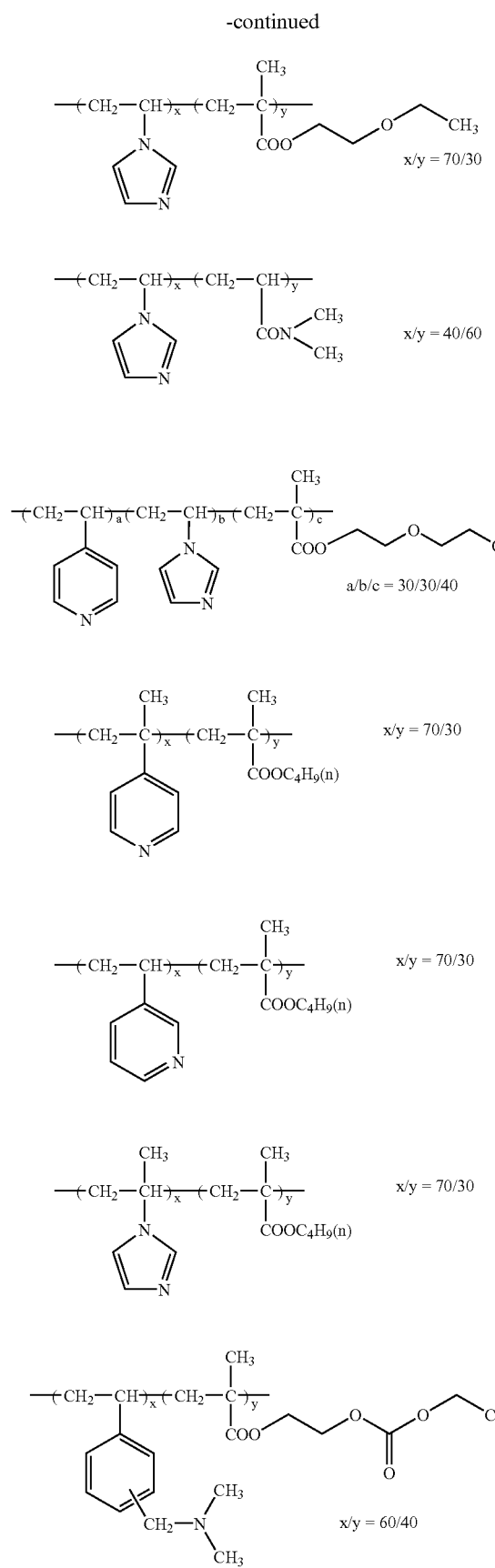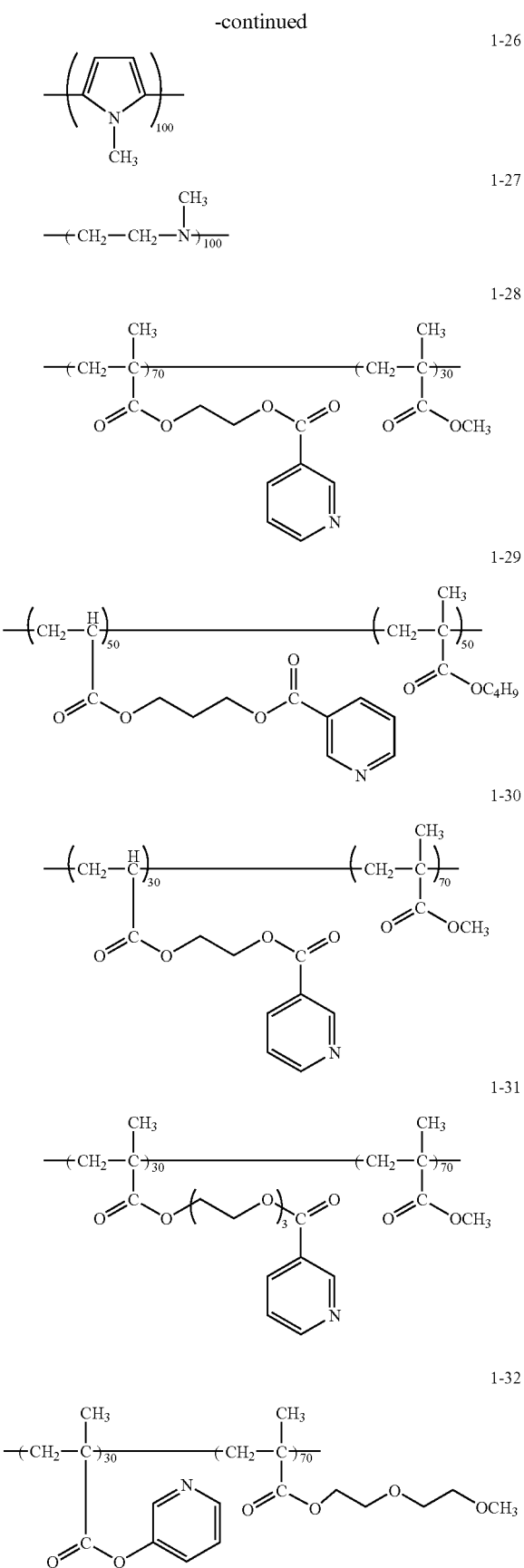

1-33
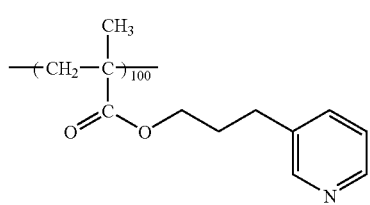
1-34
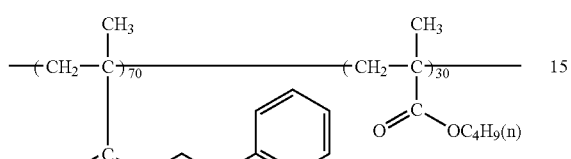
1-35
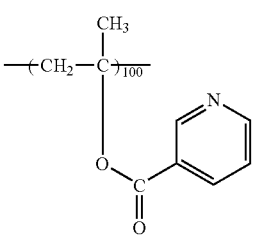
1-36
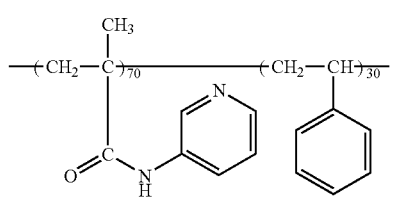
1-37
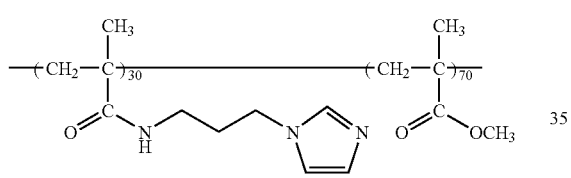
1-38
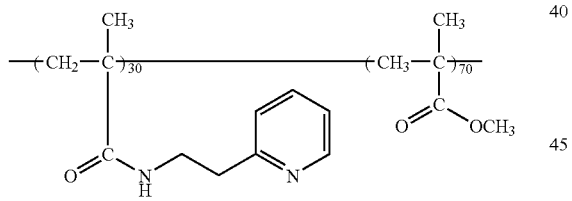
1-39
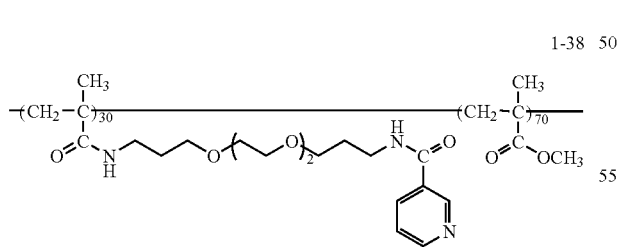
1-40
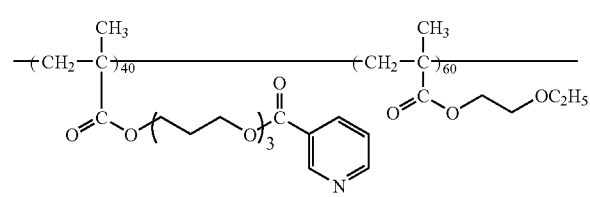
1-41
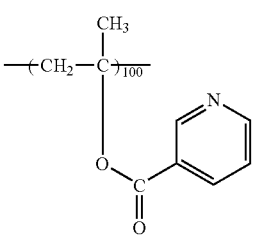
1-42
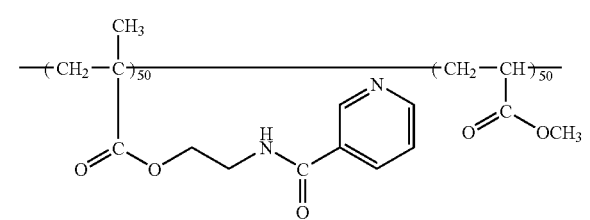
1-43
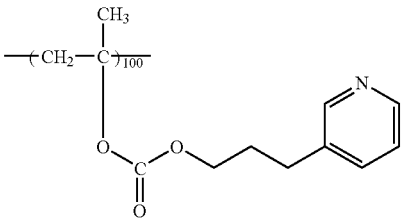
1-44
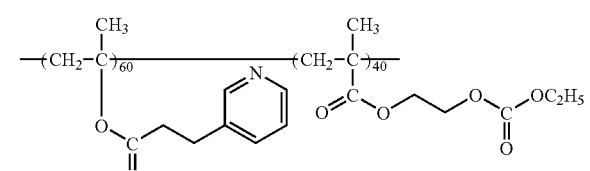
1-45
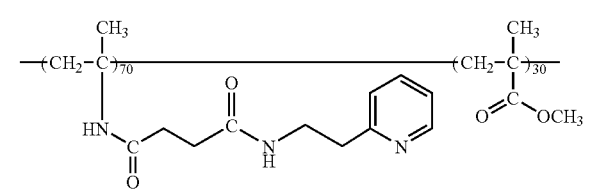

-continued

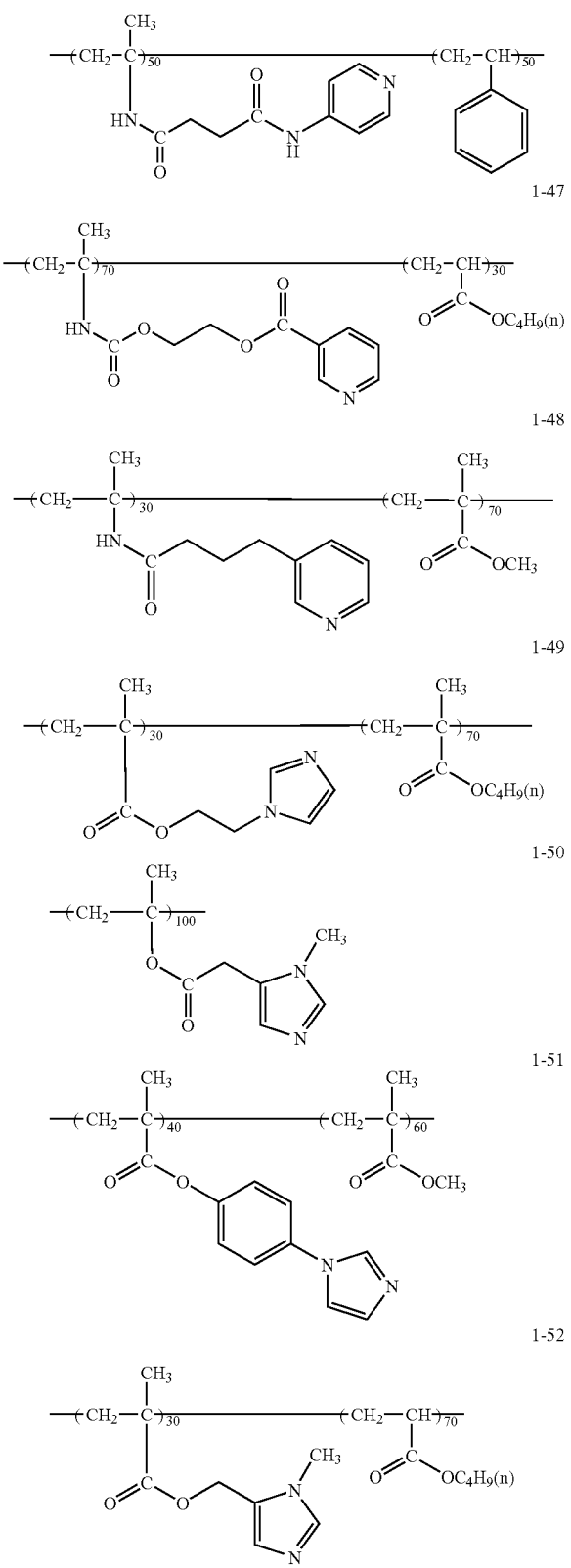

The nitrogen-containing polymer of the invention can be synthesized by radical polymerization which is a general method for polymerization synthesis, described in Takayuki Ohtsu and Masaetsu Kinoshita, *KOBUNSHI GOSEI NO JIKKENHO*, Kagaku Dojin, or Takayuki Ohtsu, *KOZA JUGO HAN-NO-RON Radical JUGO* (1), Kagaku Dojin. Radical polymerization for obtaining the polymer of the invention can be induced by heat, light or electron rays or electrochemically, preferably by heat. Polymerization initiators for heat-induced radical polymerization preferably include azo initiators, such as 2,2'-azobisisobutyronitrile, 2,2'-azobis(2,4-dimethylvaleronitrile), dimethyl 2,2'-azobis (2-methylpropionate), and dimethyl 2,2'-azobisisobutyrate; and peroxide initiators, such as lauryl peroxide, benzoyl peroxide, and t-butyl peroctoate.

The electrophilic reagent having bi- or higher functionality (hereinafter referred to as a polyfunctional electrophilic reagent) which reacts on the nitrogen-containing polymer to give the crosslinked polymer of the invention is not particularly limited provided that it has at least two functional groups capable of reacting electrophilically with the nitrogen atom of the nitrogen-containing polymer. Examples of useful polyfunctional electrophilic reagents include alkyl halides (e.g., alkyl iodides, alkyl bromides or alkyl chlorides), aralkyl halides (e.g., aralkyl iodides, aralkyl bromides or aralkyl chlorides), esters (e.g., carboxylic esters or sulfonic esters), acid anhydrides, acid halides (e.g., acid chlorides), and isocyanates. Particularly preferred electrophilic reagents are represented by formula (I-b):

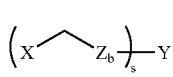

(I-b)

wherein X represents a releasing group; Y represents a single bond or an s-valent linking group; s represents an integer of 2 to 4; Zb represents a single bond or a divalent linking group.

X preferably represents such a releasing group the conjugate acid of which has a pKa of 10 or smaller, particularly 5 or smaller, for example, a halogen atom, an alkylcarbonyloxy group, an arylcarbonyloxy group, an alkylsulfonyloxy group or an arylsulfonyloxy group. The alkyl or aryl group may be substituted with, for example, a halogen atom (e.g., fluorine or chlorine) or a nitro group. Examples of the halogen atom as X includes iodine, bromine and chlorine, preferably iodine and bromine. Examples of the alkylcarbonyloxy group includes acetoxy, chloroacetyloxy, trichloroacetyloxy and perfluoroacyloxy (e.g., trifluoroacetyloxy). Examples of the arylcarbonyloxy group includes benzoyloxy, chlorobenzoyloxy, fluorobenzoyloxy, and p-nitrobenzoyloxy. Examples of the alkylsulfonyloxy group includes methanesulfonyloxy, chloromethanesulfonyloxy, and perfluoroalkylsulfonyloxy (e.g., trifluoromethanesulfonyloxy). Examples of the arylsulfonyloxy group includes benzenesulfonyloxy, p-toluenesulfonyloxy, p-chlorobenzene-sulfonyloxy, and p-nitrobenzenesulfonyloxy.

When s is 2, Y is preferably a single bond, —O—, an alkylene group, an arylene group, or a divalent linking group composed of an alkylene group and/or an arylene group and at least one of —CO—, —O— and —S—. When s is 2, Y is more preferably —$(CH_2)_k$— (k: an integer of 2 to 10), —$CH_2OCH_2$—, —$(CH_2CH_2O)_m CH_2CH_2$—(m: an integer of 1 to 30), $(C_3H_7O)_m$—$C_3H_7$—(m: an integer of 1 to 30), o—, m— or p-phenylene, and 4,4'-isopropylidenediphenylene. Those having I to 16 carbon atoms are particularly preferred. These linking groups may have a substituent(s), such as an alkyl group (e.g., methyl or ethyl), an aryl group (e.g., phenyl or naphthyl), a halogen atom (e.g., fluorine, chlorine, bromine or iodine), a hydroxyl group, a carboxyl group, a sulfo group, an acylamino group (e.g., acetamido or benzamido), a sulfonamide group, a carbamoyl group, an acyloxy group, an alkoxycarbonyl group, an acyl group, an alkoxy group (e.g., methoxy, ethoxy or methoxyethoxy), an aryloxy group (e.g., phenoxy), a nitro group, a formyl group, an alkylsulfonyl group, an arylsulfonyl group, an amino group, an aryl group, etc.

When s is 3, Y is preferably a trivalent group derived from benzene (i.e., benzenetriyl), methylidyne, or a trivalent linking group composed of either benzenetriyl or methylidyne and the above-described divalent linking group. These linking groups may have a substituent(s), such as those enumerated as for the divalent linking groups. Preferred trivalent linking groups are shown below.

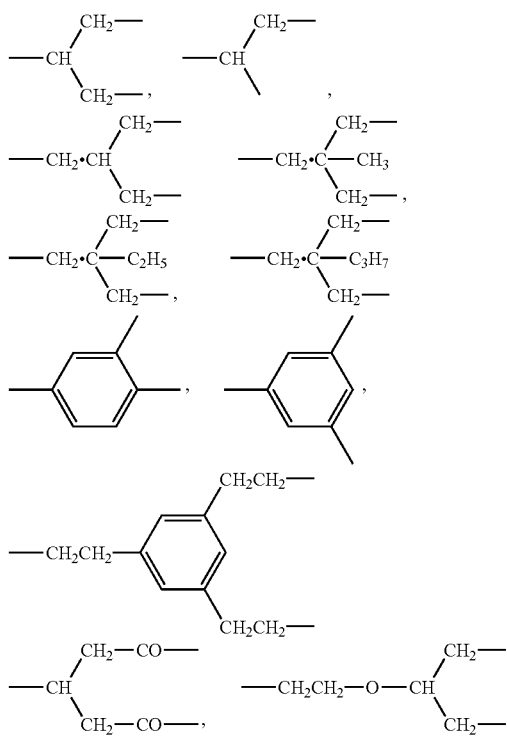

When s is 4, Y is preferably a tetravalent linking group derived from methane or benzene or a tetravalent linking group composed of the one derived from methane or benzene and the above-described divalent linking group. These tetravalent linking groups may have a substituent(s), such as those enumerated above as for the divalent linking groups. Examples of preferred tetravalent linking groups are shown below.

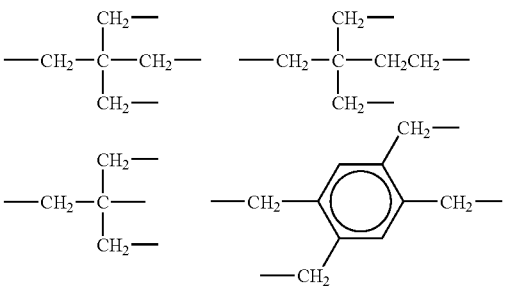

Examples of the preferable divalent linking group as represented by Zb includes an arylene group (e.g., phenylene or naphthylene) or a divalent functional group containing a hetero atom. These linking groups may have a substituent(s), such as an alkyl group (e.g., methyl or ethyl), a halogen atom (e.g., fluorine, chlorine, bromine or iodine), a carboxyl group, a sulfo group, an alkoxycarbonyl group, an acyl group, a nitro group, a formyl group, an alkylsulfonyl group, and an arylsulfonyl group. The divalent functional group having a hetero atom is mostly an electron-attracting functional group, such as —CO—, —COO—, —SO—, —SO$_2$—, and —CONR— (R: hydrogen or an alkyl group). Zb is preferably an unsubstituted phenylene group, —CO—, —COO—, —SO—, —SO$_2$— or —CONR—.

The methylene group between X and Zb may have a substituent(s), such as those enumerated above as for the divalent linking groups represented by Y.

The polyfunctional electrophilic reagent has 2 to 10 sites, preferably 2 to 5 sites, more preferably 2 to 4 sites, capable of reacting with the nitrogen atom of the polymer.

The electrophilic reagent is preferably used in an amount of 0.01 to 2 equivalents, still preferably 0.05 to 1.5 equivalents, particularly preferably 0.1 to 1 equivalent, to the mole number of the nitrogen atom of the nitrogen-containing polymer. The electrophilic reagents can be used either individually or as a combination of two or more thereof.

Specific but non-limiting examples of preferred electrophilic reagents are shown below.

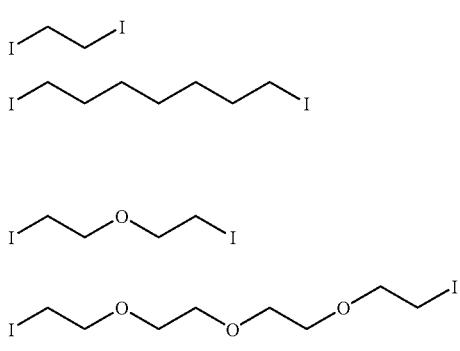

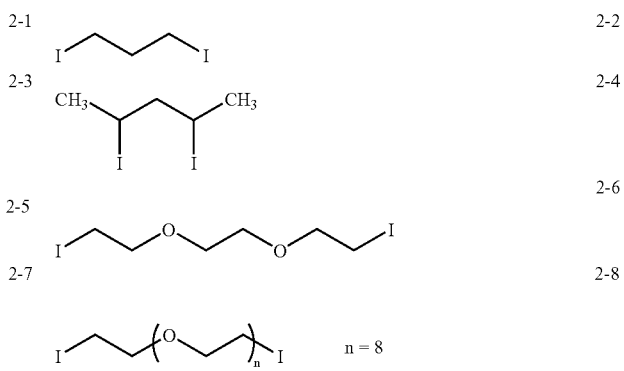

-continued
| | |
|---|---|
| 2-9 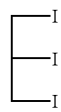 | 2-10 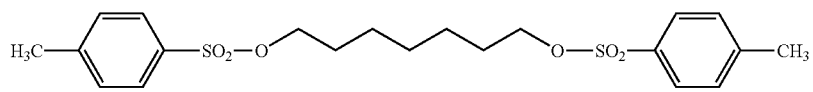 |
| 2-11 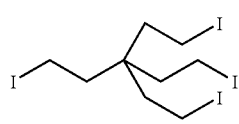 | 2-12 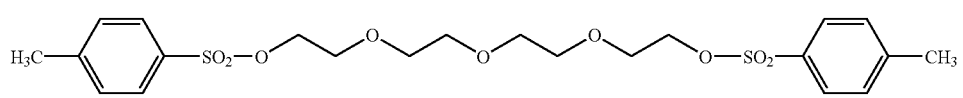 |
| 2-13 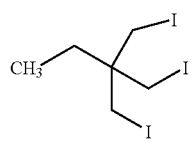 | |
| 2-14 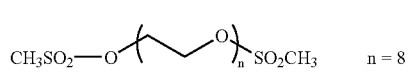 | |
| 2-15 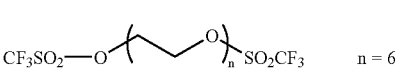 | |
| 2-16 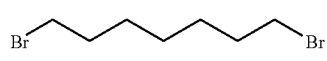 n = 8 | 2-17  n = 6 |
| 2-18 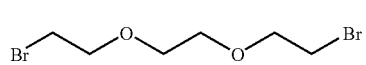 | 2-19  |
| 2-20 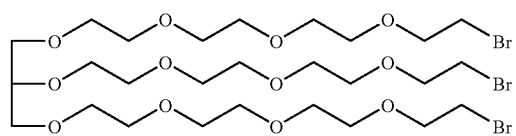 | 2-21 C(CH$_2$Br)$_4$ |
| 2-22 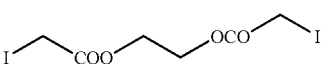 | 2-23  |
| 2-24 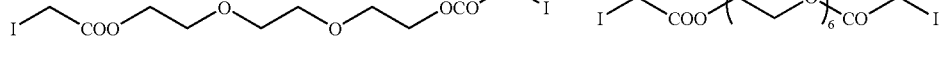 | 2-25 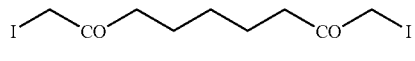 |
| 2-26 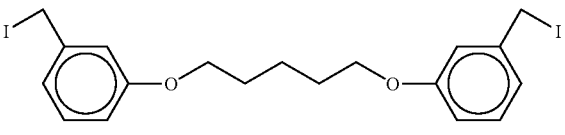 | 2-27 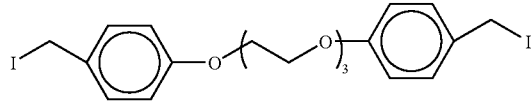 |
| 2-28 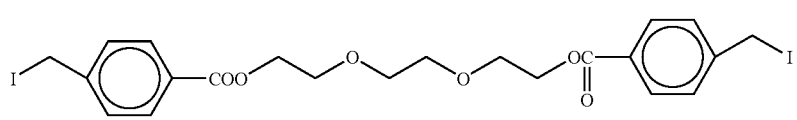 | |
| 2-29 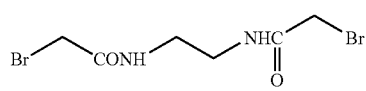 | |
| 2-30 | 2-31 |

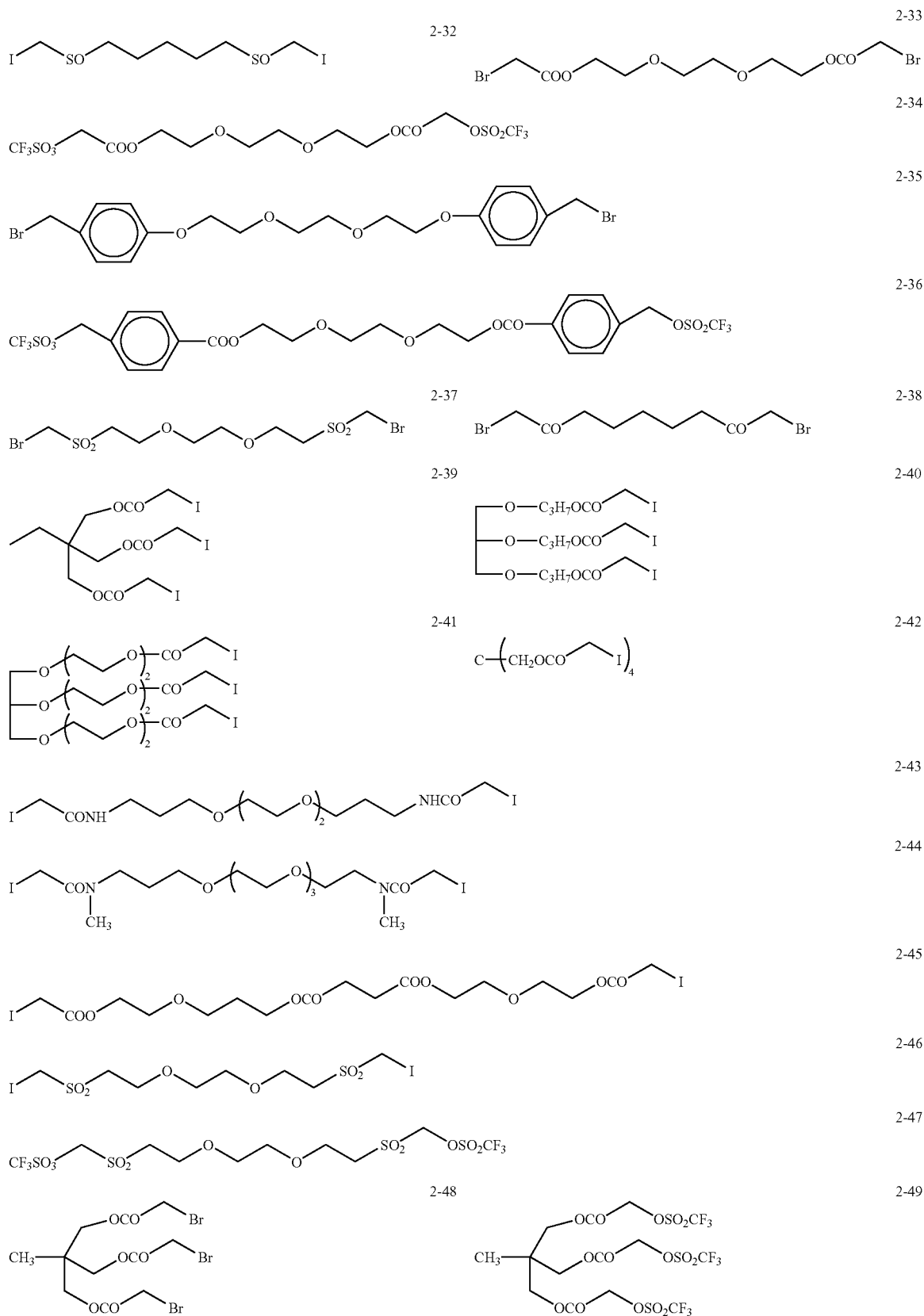

-continued

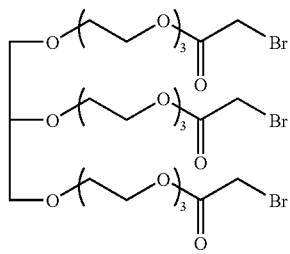
2-50

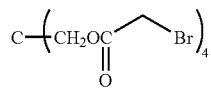
2-51

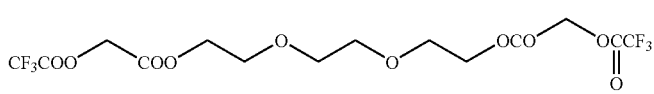
2-52

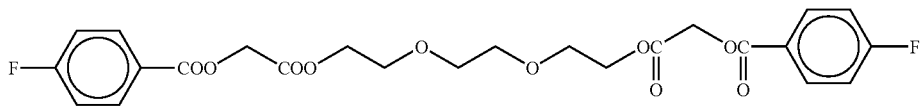
2-53

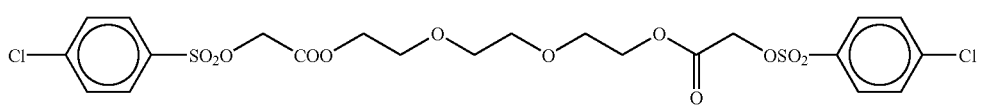
2-54

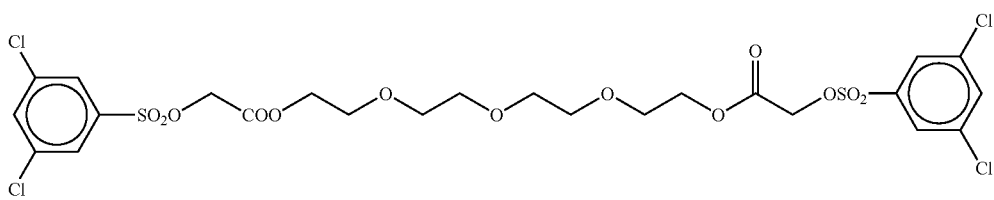
2-55

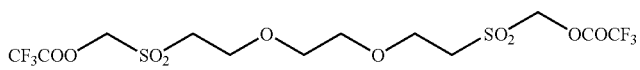
2-56

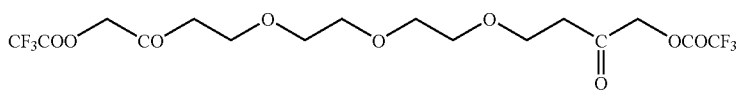
2-57

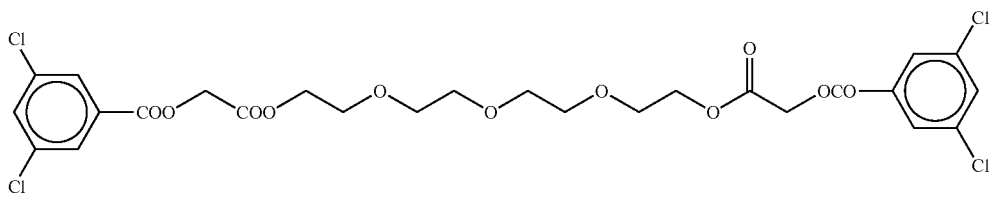
2-58

Salts which can be used in the electrolyte of the invention include metal iodides, such as LiI, NaI, KI, CsI, and $CaI_2$; an iodine salt of quaternary ammonium compounds, such as an imidazolium compound, a pyridinium compound, and a tetraalkylammonium compound; $Br_2$ and a metal bromide, such as LiBr, NaBr, KBr, CsBr or $CaBr_2$; $Br_2$ and a bromine salt of a quaternary ammonium compound, such as a tetraalkylammonium bromide or pyridinium bromide; metal complexes, such as a ferrocyananate-ferricyanate or a ferrocene-ferricinium ion; sulfur compounds, such as poly(sodium sulfite) and an alkylthiol-alkyl disulfide; viologen dyes; hydroquinone-quinone, and the like. Preferred of them are metal iodides (e.g., LiI, NaI, KI, CsI, and $CaI_2$), and an iodine salt of quaternary compounds such as an imidazolium compound, a pyridinium compound, and a tetraalkylammonium compound. These electrolyte salts can be used either individually or as a mixture of two or more thereof.

The electrolyte preferably contains the salt in a concentration of 0.05 to 2 mol/l, particularly 0.1 to 1.5 mol/l. Iodine can be added to the electrolyte to previously form a redox pair. A preferred concentration of iodine, if added, is 0.01 to 0.3 mol/l. The concentrations as referred to here are based on the electrolyte solution exclusive of the polymer.

So-called molten salts that are in a molten state at room temperature which are described in EP 718288, WO95/18456, *J. Electrochem. Soc.*, vol. 143, No. 10, p. 3099 (1996), and *Inorg. Chem.*, vol. 35, pp. 1168-1178 (1996) can also be used as an electrolyte salt. In using the molten salt, there is no need to use a solvent.

It is preferred for the electrolyte to comprise, in addition to the crosslinked polymer and the salt, a solvent capable of dissolving the salt. The solvent that can be used in the electrolyte is preferably a compound having excellent ion conductivity. In order to exhibit excellent ion conductivity, it is preferred for the solvent to have a low viscosity for improving an ion mobility, and/or to enhance a dielectric constant for increasing the effective carrier concentration. Examples of suitable solvents include carbonic acid ester derivatives, e.g., ethylene carbonate, propylene carbonate, vinylene carbonate, butylene carbonate, dimethyl carbonate, diethyl carbonate, methylethyl carbonate, and dipropyl carbonate; lactone derivatives, e.g., γ-butyrolactone, γ-valerolactone, γ-caprylolactone, crotolactone, γ-caprolactone, and δ-valerolactone; ether derivatives, e.g., ethyl ether, 1,2-dimethoxyethane, diethoxyethane, trimethoxymethane, ethylene glycol dimethyl ether, polyethylene glycol dimethyl ether, 1,3-dioxolane, and 1,4-dioxolane; alcohol derivatives, e.g., methanol, ethanol, ethylene glycol monomethyl ether, propylene glycol monoethyl ether, polyethylene glycol monoalkyl ethers, and polypropylene glycol monoalkyl ethers; polyhydric alcohol derivatives, e.g., ethylene glycol, propylene glycol, polyethylene glycol, polypropylene glycol, and glycerol; tetrahydrofuran derivatives, e.g., tetrahydrofuran and 2-methyltetrahydrofuran; nitrile derivatives, e.g., acetonitrile, glutarodinitrile, propionitrile, methoxyacetonitrile, and benzonitrile; carboxylic esters, e.g., methyl formate, methyl acetate, ethyl acetate, and methyl propionate; phosphoric triesters, e.g., trimethyl phosphate and triethyl phosphate; heterocyclic compounds, e.g., N-methylpyrrolidone, 4-methyl 1,3-dioxane, 2-methyl-1,3-dioxolane, 3-methyl-2-oxazolidinone, 1,3-propanesulfone, and sulfolane; aprotic organic compounds, e.g., dimethyl sulfoxide, formamide, N,N-dimethylformamide, and nitromethane; and water. Preferred of them are carbonic acid esters, nitrile derivatives, and heterocyclic compounds. These solvents can be used either individually or as a combination of two or more thereof.

In particular, the compounds represented by formulae (I-c) and (1-d) shown below, which are high-boiling point organic solvents, are preferably used as a solvent in the electrolyte.

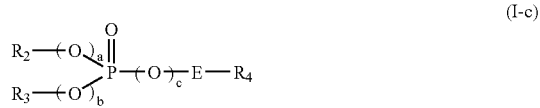
(I-c)

wherein $R_2$ and $R_3$, which may be the same or different, each represent an alkyl group, an alkenyl group or an aryl group; $R_4$ represents a cyano group, an alkoxycarbonyl group, an acyloxy group, a carbonamido group, a phosphoric acid group, a phosphono group, a phosphino group, a phosphoryl group, a carbamoyl group, a urethane group, a urea group, a carbonate group, a sulfonamido group, a sulfamoyl group, a sulfoxide group, a sulfone group, a sulfonyl group, a nitro group, an alkoxy group, an aryloxy group or a hydroxyl group; E represents a single bond, an alkylene group, an alkenylene group or an arylene group; and a, b, and c each represent 0 or 1.

$R_5\text{-D-E-}R_4$ (I-d)

wherein $R_4$ and E have the same meaning as defined above; $R_5$ represents a heterocyclic group or an alkyl, alkenyl or aryl group having a heterocyclic group; and D represents —O—, —OC(O)— or —OC(O)O—.

Because the compounds of formulae (I-c) and (I-d) exhibit low volatility when they are used as a solvent in the electrolyte of the invention, they are effective in preventing a photoelectric conversion device from deterioration of performance with time. That is, the electrolyte containing these solvents provides a photoelectric conversion device excellent in durability, for example, free from reduction in short circuit current density with time. From the viewpoint of volatility resistance, it is preferred for the compounds of formulae (I-c) and (I-d) to have a boiling point of 200° C. or higher, particularly 250° C. or higher. From the standpoint of photoelectric conversion characteristics of a photoelectric conversion device, such as a short circuit current density and a conversion efficiency, it is preferred for these compounds to have a low viscosity and a high dielectric constant for the same reasons as stated above.

In formula (I-c), $R_2$ and $R_3$ each independently represent a substituted or unsubstituted and straight-chain or branched alkyl group which preferably contains 1 to 20 carbon atoms, e.g., methyl, ethyl, propyl, butyl, isopropyl, hexyl, t-octyl benzyl, 2-ethoxyethyl or 2-butoxyethyl; a substituted or unsubstituted and straight-chain or branched alkenyl group which preferably contains 2 to 20 carbon atoms, e.g., vinyl or allyl; or a substituted or unsubstituted and mono- or polycyclic aryl group which preferably contains 6 to 20 carbon atoms, e.g., phenyl, 4-methoxyphenyl, 4-cyanophenyl or 1-naphthyl. $R_2$ and $R_3$ each preferably represent an alkyl group. $R_2$ and $R_3$ may be the same or different but are preferably the same.

In formulae (I-c) and (I-d), $R_4$ can have a substituent. $R_4$ is preferably a cyano group, an alkoxycarbonyl group, an acyloxy group, a phosphoric acid group, a phosphono group, a phosphino group, a phosphoryl group, a carbonate group, a sulfoxide group, a sulfone group, an alkoxy group or a hydroxyl group, still preferably a cyano group, an alkoxycarbonyl group, an acyloxy group, a phosphoric acid group, a phosphoryl group, a carbonate group or an alkoxy group. A cyano group is the most preferred.

The alkylene or alkenylene group as represented by E in formulae (I-c) and (I-d) may be substituted or unsubstituted and be either a straight-chain or a branched chain. The arylene group as E may be monocyclic or polycyclic and may be substituted or unsubstituted. E is preferably an alkylene group having 1 to 8 carbon atoms, more preferably an unsubstituted alkylene group having 1 to 8 carbon atoms, particularly preferably a methylene group, an ethylene group, a propylene group or a butylene group.

In formula (I-c), a is preferably 1; b is preferably 1; and c is preferably 0.

In formula (I-d), D represents —O—, —OC(O)— (the direction of bonding is no object) or —OC(O)O—, preferably —OC(O)— or —OC(O)O—, still preferably —OC(O)—.

In formula (I-d), R5 represents a heterocyclic group or an alkyl, alkenyl or aryl group having a heterocyclic group; wherein the heterocyclic group may be substituted or unsubstituted and may be monocyclic or polycyclic, the alkyl or alkenyl group may be straight or branched, and the aryl group may be monocyclic or polycyclic. $R_5$ is preferably an alkyl group containing 1 to 8 carbon atoms and having a heterocyclic group bonded to the terminal carbon atom thereof. The heterocyclic group is preferably a 5- or 6-membered saturated heterocyclic group. Preferred examples of the heterocyclic ring in $R_5$ are a tetrahydrofuran ring, a 1,4-dioxane ring, a tetrahydropyran ring, an ethylene carbonate ring, a propylene carbonate ring, an imidazolidinone ring, a pyrrolidone ring, an oxazolidinone ring, and a tetrahydrothiophene ring. More preferred are a tetrahydrofuran ring, an ethylene carbonate ring, a pyrrolidone ring, and an oxazolidinone ring. Condensed rings composed of these heterocyclic rings are also preferred.

The compounds of formula (I-c) are preferred as compared with the compounds of formula (I-d).

Specific but non-limiting examples of the compounds of formulae (I-c) and (I-d) are shown below. These compounds can be used either individually or as a combination of two or more thereof.

S-1: tetrahydrofuran-2-yl-CH₂OCH₂CH₂CN

S-2: tetrahydrofuran-2-yl-CH₂OCCH₂CN (with C=O)

S-3: tetrahydrofuran-2-yl-CH₂OCOCH₂CH₂CN

S-4: NCCH₂COCH₂— (bicyclic difuran) —CH₂OCCH₂CN

S-5: (1,3-dioxolan-2-one-4-yl)-CH₂OCCH₂CN

S-6: oxazolidinone-N-CH₂CH₂OCCH₂CN

S-7: pyrrolidinone-N-CH₂CH₂OCH₂CH₂OCH₂CH₂CN

S-8: (1,4-dioxan-2-yl)-CH₂OCCH₂CN

S-9: (tetrahydropyran-2-yl)-CH₂OCOCH₂CH₂COOCH₃

-continued

S-10: (tetrahydrothiophen-2-yl)-CH₂OCH₂CH₂OCCH₂SO₂CH₃

S-11: $(C_2H_5O)_2P(O)CH_2CH_2CN$

S-12: $(CH_3O)_2P(O)CH_2CH_2CN$

S-13: $(C_4H_9O)_2P(O)CH_2CH_2CN$

S-14: $(C_2H_5O)_2P(O)CH_2CH_2COC_2H_5$

S-15: $(C_2H_5O)_2P(O)CH_2COC_2H_5$

S-16: $(C_2H_5O)_2P(O)CH_2CN$

S-17: $(C_2H_5O)_2P(O)CH_2CH_2CN(CH_3)_2$ (with C=O on N)

S-18: $(C_2H_5O)_2POCH_2CH_2CN$

S-19: $(C_2H_5O)_2POCH_2CH_2OCH_2CH_2OP(OC_2H_5)_2$ (with P=O)

S-20: $(NCCH_2CH_2O)_2POCH_2CH_2OP(OCH_2CH_2CN)_2$

S-21: $(NCCH_2CH_2O)_3P=O$

S-22: $C_2H_5OP(CH_2CH_2CN)_2$ (with P=O)

S-23: $(C_2H_5O)_2PCH_2CH_2OCH_2CH_2CN$ (with P=O)

S-24: (tetrahydrofuran-2-yl)-CH₂OP(O)(OC₂H₅)₂

S-25: (tetrahydrofuran-2-yl)-CH₂OP(O)(CH₂CH₂CN)₂

-continued

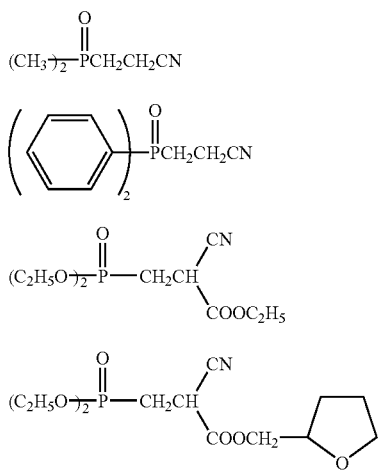

The electrolyte according to the invention is preferably obtained by preparing (i) a solution from the nitrogen-containing polymer, the polyfunctional electrophilic reagent, and a solvent having dissolved therein a salt or (ii) a solution from monomers providing the nitrogen-containing polymer, a polymerization initiator, the polyfunctional electrophilic reagent, and a solvent having dissolved therein a salt; applying the solution (preferably the solution (i)) to an electrode by casting, coating, dipping or impregnation to form an electrolyte solution layer, and heating the solution layer to induce crosslinking thereby to form an electrolyte layer.

In forming an electrolyte layer by coating, additives such as coating property improvers (e.g., levelling agents), are added to the solution (i) to prepare a uniform coating solution, and the solution is applied by spin coating, dip coating, air knife coating, curtain coating, roller coating, a wire bar coating, gravure coating, extrusion coating by use of a hopper (see U.S. Pat. No. 2,681,294), multilayer simultaneous coating (see U.S. Pat. Nos. 2,761,418, 3,508,947, and 2,761,791) or a like coating technique. After coating, crosslinking reaction is carried out by heating at a temperature appropriately decided according to the heat resistance temperature of the dye used (hereinafter described), and the like, preferably 10 to 200° C., still preferably 30 to 150° C., for a period properly selected according to the reaction conditions such as temperature, usually about 5 minutes to 72,hours.

Where a substance such as iodine is introduced into the electrolyte to make a redox pair, the substance can be added to the above-described electrolyte solution, or introduction of a substance such as iodine, can be performed by putting a formed electrolyte layer in a closed container together with the substance to be introduced (e.g., iodine) thereby to let the substance diffuse into the electrolyte layer. It is also possible to apply the substance (e.g., iodine) to a counter electrode (hereinafter described in detail) by coating or vapor deposition so that the substance may be introduced into the electrolyte layer in the photoelectric conversion device which is used as a photo-electrochemical cell.

The proportion of the crosslinked polymer in the electrolyte of the invention is preferably 2 to 80% by weight (particularly preferably 2 to 50% by weight).

The photo-electrochemical cell using the electrolyte of the invention will be described in detail. A photo-electrochemical cell (a solar cell) is one of the application (i.e., use) of a photoelectric conversion device. The photoelectric device used in the photo-electrochemical cell comprises an electrically conductive substrate and a semiconductor layer (photosensitive layer) provided on the conductive substrate. The photo-electrochemical cell of the invention as a photoelectric conversion device preferably comprises an electrically conductive substrate, a semiconductor layer (i.e., a photosensitive layer) provided on the substrate, an electrolyte layer containing the electrolyte of the invention, and a counter electrode. The electrolyte layer, which serves for charge transport, preferably has a thickness of 0.001 to 200 μm, particularly 0.1 to 100 μm.

The semiconductor serves as a photoreceptor that absorbs light to generate electrons and positive holes. The semiconductor which can be used in the invention includes simple substance semiconductors, e.g., Si or Ge, compound semiconductors, such as metal chalcogenides (e.g., oxides, sulfides, and selenides), and perovskite semiconductors. The metal chalcogenides include an oxide of titanium, tin, zinc, iron, tungsten, zirconium, hafnium, strontium, indium, cerium, yttrium, lanthanum, vanadium, niobium or tantalum; a sulfide of cadmium, zinc, lead, silver, antimony or bismuth; a selenide of cadmium or lead; and cadmium telluride. Other compound semiconductors include a phosphide of zinc, potassium, indium or cadmium, gallium arsenide, copper indium selenide, and copper indium sulfide. The perovskite semiconductors include strontium titanate, calcium titanate, sodium titanate, barium titanate, and potassium niobate.

Preferred semiconductors for use in the invention include Si, $TiO_2$, $SnO_2$, $Fe_2O_3$, $WO_3$, ZnO, $Nb_2O_5$, CdS, ZnS, Pbs, $Bi_2S_3$, CdSe, GaP, InP, GaAs, CdTe, $CuInS_2$, and $CuInSe_2$. More preferred are $TiO_2$, $ZnO_2$, $SnO_2$, $FeO_2O_3$, $WO_3$, $Nhd2O_5$, CdS, PbS, CdSe, InP, GaAs, $CuInS_2$, and $CuInSe_2$.

The semiconductor may be a single crystal or polycrystalline. A single crystal is preferred for conversion efficiency, while a polycrystalline semiconductor is preferred from the standpoint of production cost, supply of raw materials, and an energy payback time. Finely particulate semiconductors having a particle size on the order of nanometers to microns are particularly preferred. The particulate semiconductors preferably have an average primary particle size of 5 to 200 nm, particularly 8 to 100 nm, in terms of a projected circle-equivalent diameter. The semiconductor particles in a dispersed state preferably have an average particle size of 0.01 to 100 μm.

It is preferred for the particulate semiconductors, particularly metal oxide semiconductors, to be sensitized with dyes. For example, $TiO_2$, ZnO, $SnO_2$, $Fe_2O_3$, $WO_3$, and $Nb_2O_5$ are preferred for semiconductors to be dye-sensitized. $TiO_2$ is particularly preferred to be dye-sensitized.

Details of the photo-electrochemical cells using dye-sensitized semiconductor particles are given below.

The electrically conductive substrate includes a substrate made of a conductive material, such as metal, and a nonconductive substrate made of glass or plastics having on the surface thereof an electrical conductor layer. Preferred conductors for use in the latter type of conductive substrates include metals (e.g., platinum, gold, silver, copper, aluminum, rhodium, and indium), carbon, and electrically conducting metal oxides (e.g., indium-tin composite oxide and F-doped tin oxide). Of the above conductive substrates particularly preferred is a conductive glass substrate obtained by depositing F-doped tin dioxide on a transparent substrate made of inexpensive soda-lime float glass. The conductor layer preferably has a thickness of about 0.02 to 10 μm.

The conductive substrate preferably has as low a surface resistivity as possible. A desirable surface resistivity is 100

Ω/cm² or smaller, particularly 40 Ω/cm² or smaller. While not limiting, the practically possible minimal surface resistivity is about 0.1 Ω/cm².

It is preferred that the conductive substrate be substantially transparent to light. The term "substantially transparent" means that the light transmission is at least 10%, preferably 50% or more, still preferably 70% or more. A glass or plastic substrate having an electrically conductive metal oxide layer is preferred as a transparent substrate. The amount of the conductive metal oxide is preferably 0.01 to 100 g/m². The transparent conductive substrate is preferably used in such a manner that incident light enters from the side of the glass or plastic substrate.

The semiconductor particles are applied to the conductive substrate by, for example, a method comprising coating the conductive substrate with a dispersion or colloidal solution of the semiconductor particles or a sol-gel process comprising applying a precursor of the semiconductor particles onto the conductive substrate and hydrolyzing the precursor with moisture in air to form a particulate semiconductor film. A dispersion of the semiconductor particles is prepared by the above-mentioned sol-gel process, a method comprising grinding a semiconductor in a mortar, or a method comprising wet grinding and dispersing a semiconductor in a mill. A synthetic semiconductor as precipitated in a solvent in the form of fine particles can also be used as such. Useful dispersing media include water and various organic solvents, such as methanol, ethanol, isopropyl alcohol, dichloromethane, acetone, acetonitrile, and ethyl acetate. In preparing a dispersion, a polymer, a surface active agent, an acid, a chelating agent, and the like may be added as a dispersing aid.

It is preferable for the semiconductor particles to have a large surface area so that they may adsorb as large an amount of a dye as possible. The surface area of the semiconductor particles in the state applied to the conductive substrate is preferably 10 times or more, still preferably 100 times or more, the projected area. The upper limit of the surface area is, while not limited, practically about 1000 times the projected area.

In general, as the thickness of the particulate semiconductor layer increases, the amount of the supported dye per unit projected area increases to show increased ability of capturing light, but the distance of diffusion of generated electrons also increases, which results in an increased loss due to recoupling of charges. Accordingly, there is a favorable thickness range for the particulate semiconductor layer, which is typically from 0.1 to 100 μm. For use in a photo-electrochemical cell, the thickness is preferably 1 to 30 μm, still preferably 3 to 20 μm. It is preferred that the semiconductor particles applied to the substrate be calcined so that the particles may be brought into electronic contact among themselves to secure improved film strength and improved adhesion to the substrate. A preferred calcined temperature is 40° C. or higher and lower than 700° C., particularly from 40 to 650° C. The calcining time is usually from 10 minutes to about 10 hours. For the purpose of increasing the surface area of the semiconductor particles and of increasing the purity in the vicinities of the semiconductor particles thereby to improve electron injection efficiency from the dye to the semiconductor particles, the calcined particulate semiconductor layer can be subjected to chemical plating with a titanium tetrachloride aqueous solution or electrochemical plating with a titanium trichloride aqueous solution.

The amount of the semiconductor particles to be applied is preferably 0.5 to 500 g/m², still preferably 5 to 100 g/m².

The dye which can be used in the present invention preferably includes metal complex dyes and/or polymethine dyes.

It is preferred for the dye to have an appropriate interlocking group for linking to the surface of the semiconductor particles. Preferred interlocking groups include —COOH, —SO₃H, a cyano group, —P(O)(OH)₂, —OP(O)(OH)₂, and chelating groups having pi conductivity, such as oxime, dioxime, hydroxyquinoline, salicylate and α-keto-enolate groups. Particularly preferred of them are —COOH, —P(O)(OH)₂, and —OP(O)(OH)₂. The interlocking group may be in the form of a salt with an alkali metal, etc. or an intramolecular salt. Where the methine chain of a polymethine dye has an acidic group as in the case where the methine chain forms a squarylium ring or a croconium ring, that moiety can be used as a interlocking group.

The metal complex dyes preferably include ruthenium complex dyes. Those represented by formula (II) are still preferred.

$(Y_1)_p RuB_a B_b B_c$          (II)

wherein $Y_1$ represents a ligand selected from the group consisting of Cl, SCN, H₂O, Br, I, CN, —NCO and SeCN; p represents an integer of 0 to 2, preferably 2; and $B_a$, $B_b$, and $B_c$ each represent an organic ligand selected from B-1 to B-8 shown below.

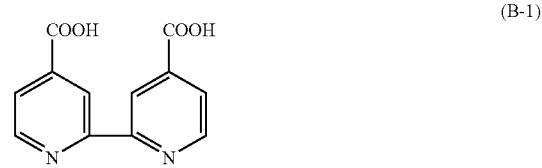
(B-1)

(B-2)

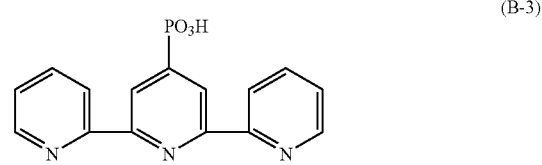
(B-3)

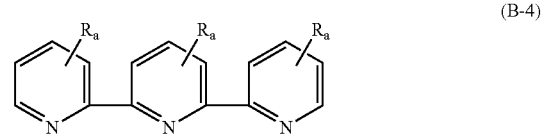
(B-4)

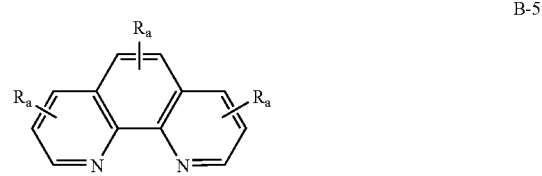
B-5

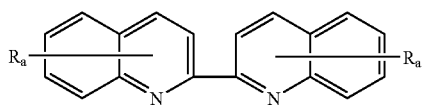
B-6

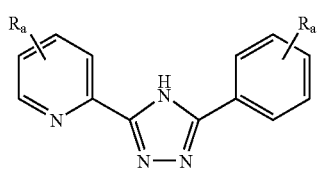
B-7

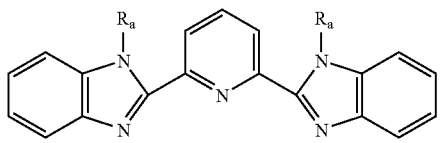
B-8 wherein $R_a$ represents a hydrogen atom, a halogen atom, a substituted or unsubstituted alkyl group having 1 to 12 carbon atoms, a substituted or unsubstituted aralkyl group having 7 to 12 carbon atoms or a substituted or unsubstituted aryl group having 6 to 12 carbon atoms. The alkyl group and the alkyl moiety of the aralkyl group may be either straight or branched, and the aryl group and the aryl moiety of the aralkyl group may be either monocyclic or polycyclic (condensed rings or independent rings).

Examples of useful ruthenium complex dyes are given in U.S. Pat. Nos. 4,927,721, 4,684,537, 5,084,365, 5,350,644, 5,463,057, and 5,525,440 and JP-A-7-249790. Specific examples of preferred ruthenium complex dyes represented by formula (II) are tabulated below.

TABLE 1

| | $(Y_1)_p RuB_a B_b B_c$ | | | | | |
|---|---|---|---|---|---|---|
| No. | $Y_1$ | p | $B_a$ | $B_b$ | $B_c$ | $R_a$ |
| R-1 | SCN | 2 | B-1 | B-1 | — | — |
| R-2 | CN | 2 | B-1 | B-1 | — | — |
| R-3 | Cl | 2 | B-1 | B-1 | — | — |
| R-4 | Br | 2 | B-1 | B-1 | — | — |
| R-5 | I | 2 | B-1 | B-1 | — | — |
| R-6 | SCN | 2 | B-1 | B-2 | — | H |
| R-7 | SCN | 1 | B-1 | B-3 | — | — |
| R-8 | Cl | 1 | B-1 | B-4 | — | H |
| R-9 | I | 2 | B-1 | B-5 | — | H |
| R-10 | SCN | 2 | B-1 | B-6 | — | H |
| R-11 | CN | 2 | B-1 | B-7 | — | H |
| R-12 | Cl | 1 | B-1 | B-8 | — | H |
| R-13 | — | 0 | B-1 | B-1 | B-1 | — |

Specific examples of other suitable metal complex dyes are shown below.

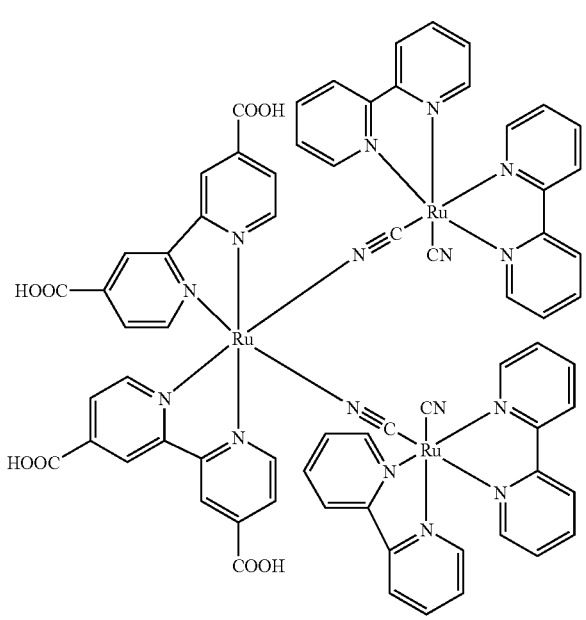
R-14

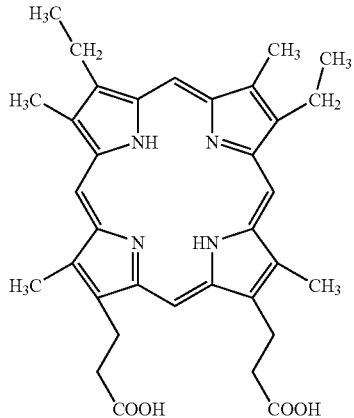
R-15

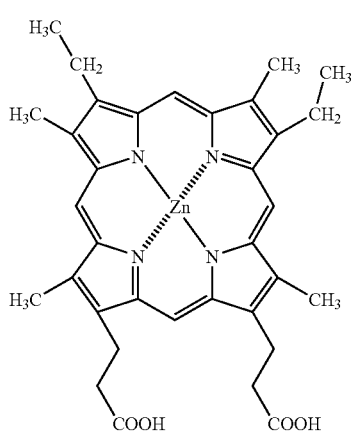
R-16

-continued

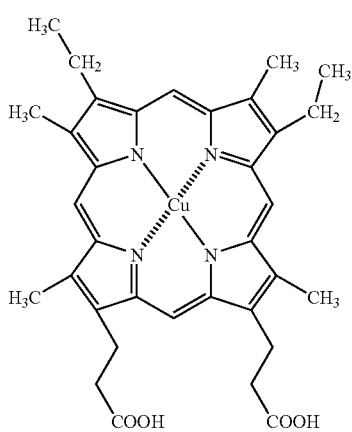
R-17

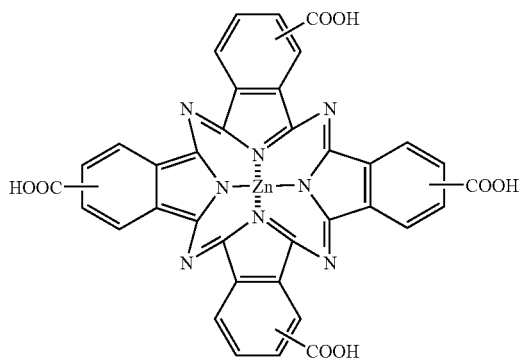
R-20

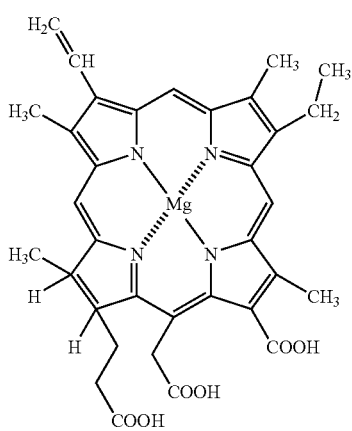
R-18

R-21

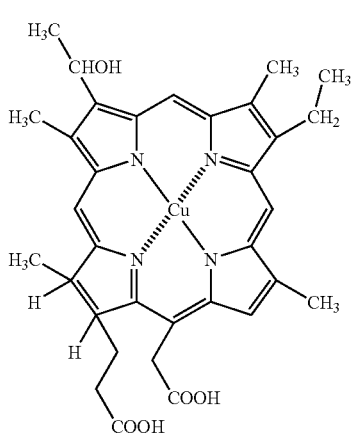
R-19

The polymethine dyes preferably include those represented by formulae (III) and (IV) shown below.

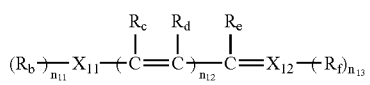
(III)

wherein $R_b$ and $R_f$ each represent a hydrogen atom, an alkyl group, an aryl group or a heterocyclic group; $R_c$, $R_d$, and $R_e$ each represent a hydrogen atom or a substituent; $R_b$, $R_c$, $R_d$, $R_e$, and $R_f$ may appropriately be taken together to form a ring; $X_{11}$ and $X_{12}$ each represent a nitrogen atom, an oxygen atom, a sulfur atom, a selenium atom or a tellurium atom; n11 and n13 each represent an integer of 0 to 2; and n12 represents an integer of 1 to 6.

The compound of formula (III) may have a counter ion in agreement with the charge quantity of the whole molecule. In formula (III), the alkyl, aryl, and heterocyclic groups may have a substituent; the alkyl group may be straight or branched; the aryl and heterocyclic groups may be monocyclic or polycyclic (condensed rings); and the ring formed of $R_b$, $R_c$, $R_d$, $R_e$, and $R_f$ may have a substituent and may be monocyclic or polycyclic.

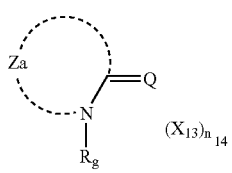

(IV)

wherein $Z_a$ represents a non-metallic atom group necessary to form a nitrogen-containing heterocyclic group; $R_g$ represents an alkyl group or an aryl group; Q represents a mono- or polymethine group necessary to complete a (poly)methine dye; $X_{13}$ represents a counter ion in balance; and n14 represents a number of from 0 up to 10 that is necessary to neutralize the charge of the molecule.

In formula (IV), the nitrogen-containing heterocyclic ring formed by Za may have a substituent and may be a single ring or a condensed ring; the alkyl or aryl groups may have a substituent; the alkyl group may be straight or branched; and the aryl group may be monocyclic or polycyclic (condensed rings).

The dyes represented by formula (IV) preferably include those represented by formulae (IV-a) through (IV-d):

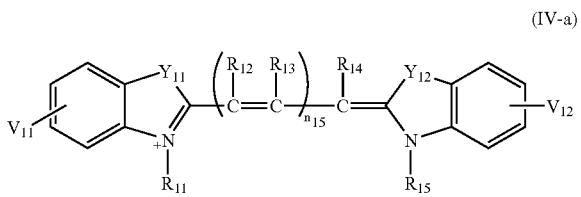

(IV-a)

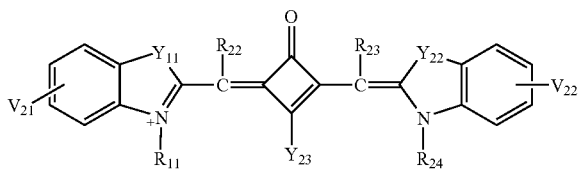

(IV-b)

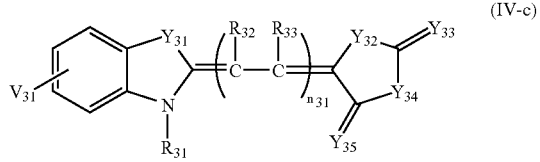

(IV-c)

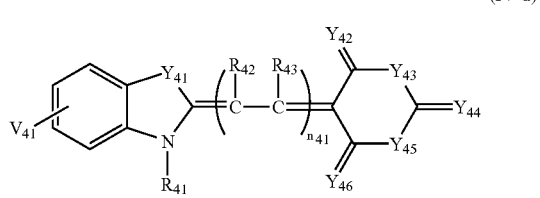

(IV-d)

wherein $R_{11}$, $R_{12}$, $R_{13}$, $R_{14}$, $R_{15}$, $R_{21}$, $R_{22}$, $R_{23}$, $R_{24}$, $R_{31}$, $R_{32}$, $R_{33}$, $R_{41}$, $R_{42}$, and $R_{43}$ each represent a hydrogen atom, an alkyl group, an aryl group or a heterocyclic group; $Y_{11}$, $Y_{12}$, $Y_{21}$, $Y_{22}$, $Y_{31}$, $Y_{32}$, $Y_{33}$, $Y_{34}$, $Y_{35}$, $Y_{41}$, $Y_{42}$, $Y_{43}$, $Y_{44}$, $Y_{45}$, and $Y_{46}$ each represent an oxygen atom, a sulfur atom, a selenium atom, a tellurium atom, —$CR_{16}R_{17}$— or —$NR_{18}$—; $R_{16}$, $R_{17}$, and $R_{18}$ each represent a hydrogen atom, an alkyl group, an aryl group or a heterocyclic group; $Y_{23}$ represents O$^-$, S$^-$, Se$^-$, Te$^-$ or —$NR_{18}^-$; $V_{11}$, $V_{12}$, $V_{21}$, $V_{22}$, $V_{31}$, and $V_{41}$ each represent a substituent; and n15, n31, and n41 each represent an integer of 1 to 6.

The compounds represented by formulae (IV-a) through (IV-d) may have a counter ion in agreement with the charge quantity of the whole molecule. In these formulae, the alkyl, aryl, and heterocyclic groups may have a substituent; the alkyl group may be straight or branched; and the aryl or heterocyclic group may be monocyclic or polycyclic (condensed rings).

Examples of the above-described polymethine dyes are given in M. Okawara, T. Kitao, T. Hirashima, and M. Matuoka, *Organic Colorants, Elsevier.*

Specific but non-limiting examples of preferred polymethine dyes represented by formulae (III) and (IV) are shown below.

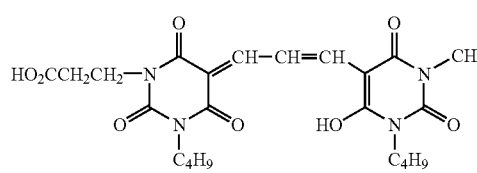

(1)

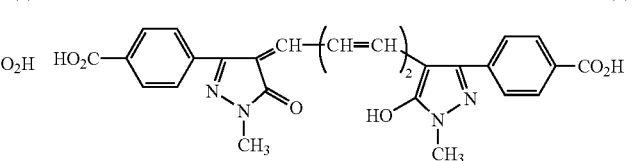

(2)

-continued
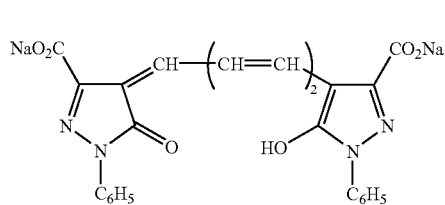 (3)
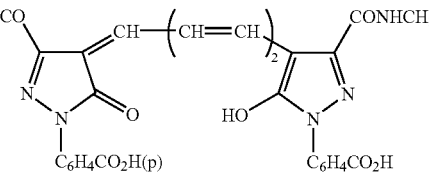 (4)
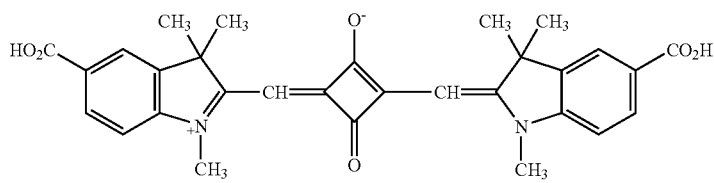 (5)
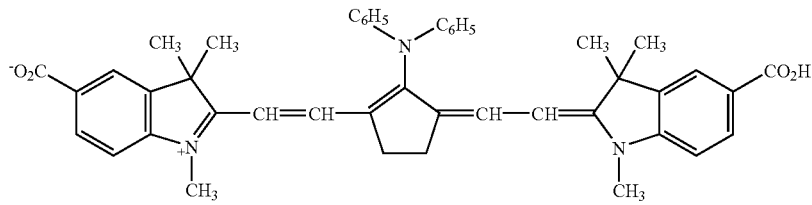 (6)
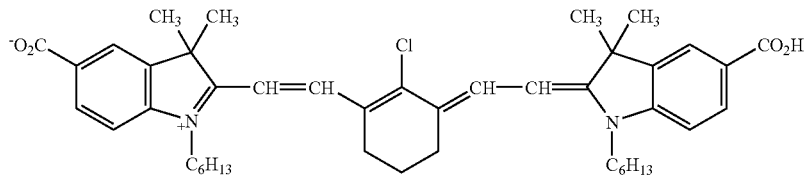 (7)
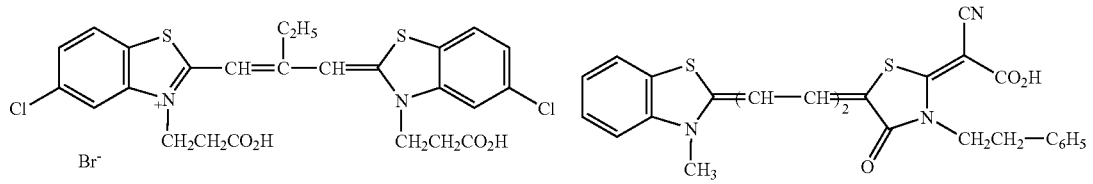 (8)
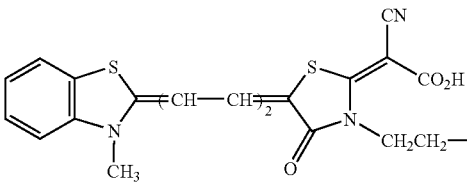 (9)
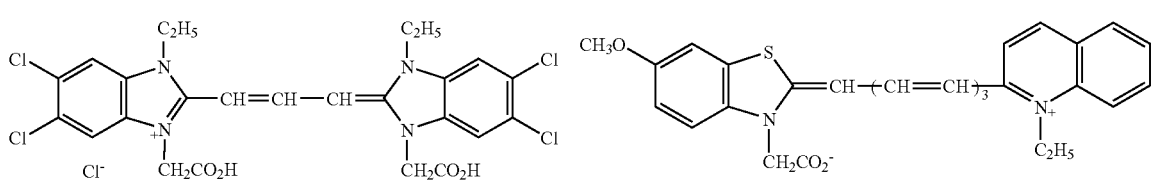 (10)
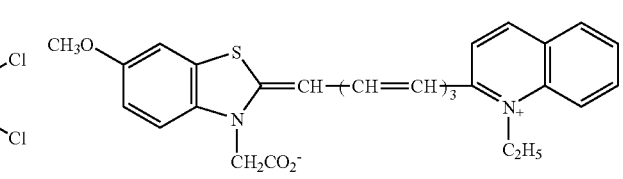 (11)
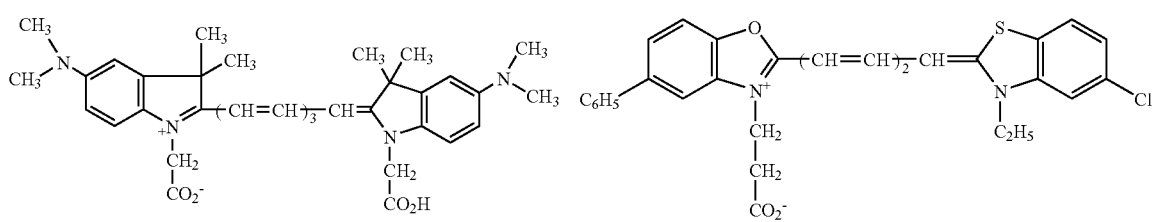 (12) (13)

-continued
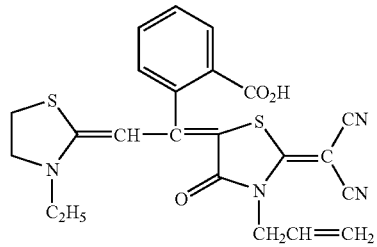
(14)
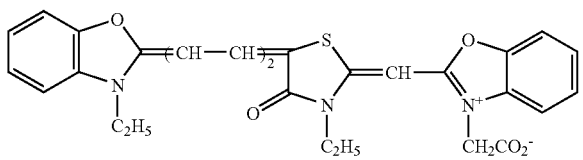
(15)
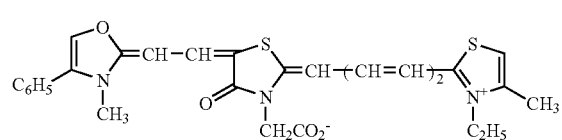
(16)
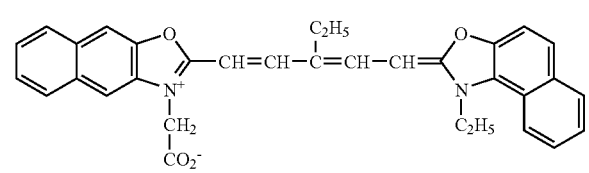
(17)
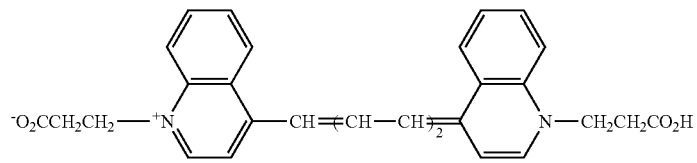
(18)
(19)
(20)
(21)
(22)
(23)
(24)
(25)
(26)
(27)
(28)

-continued
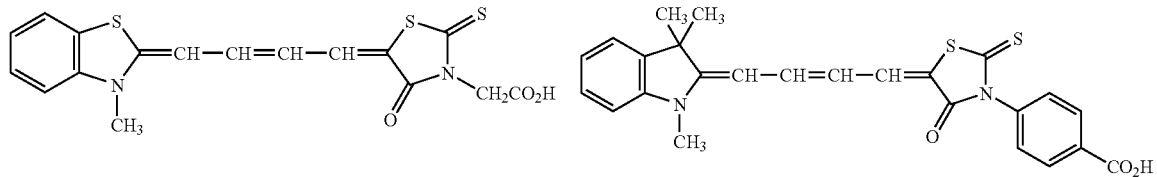
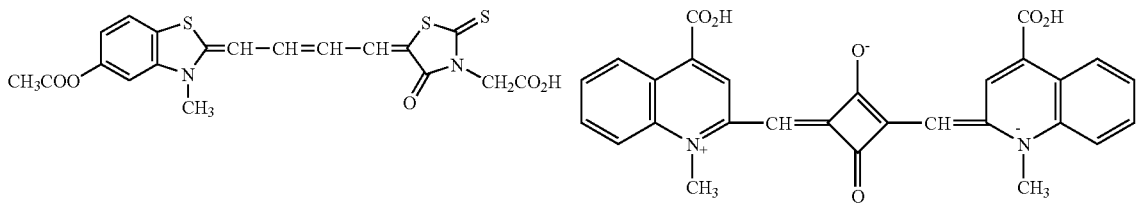
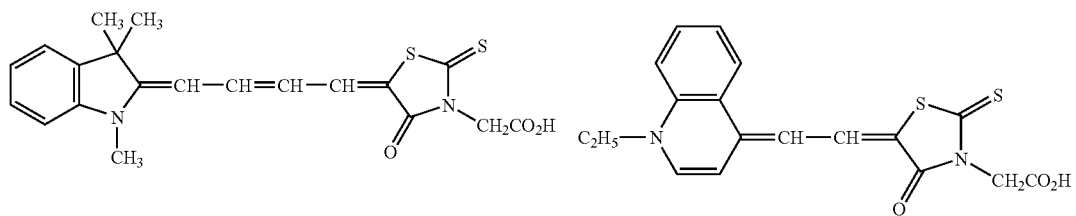
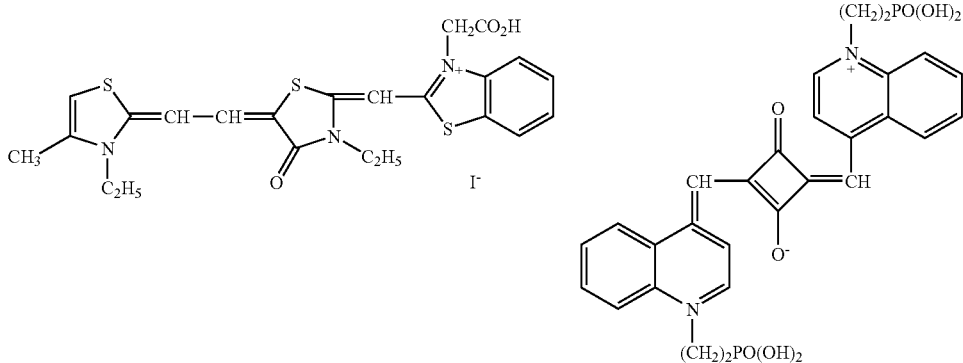
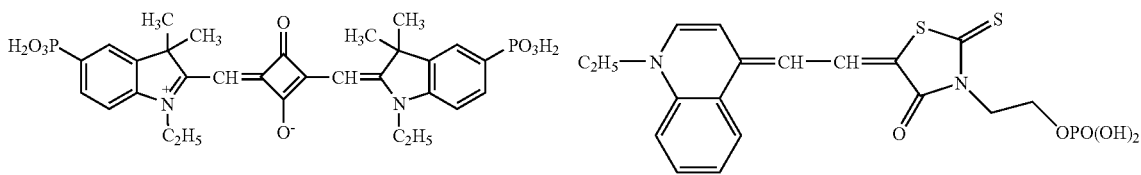
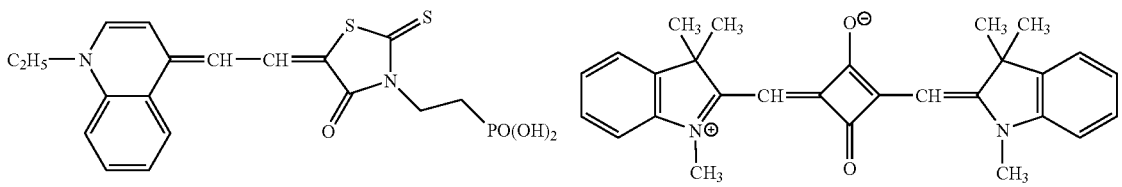

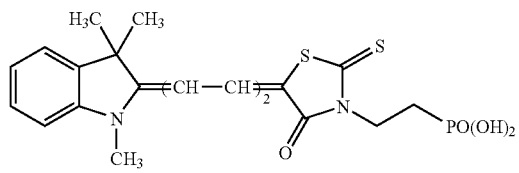 (41)

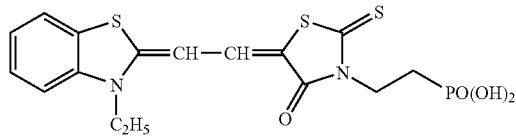 (42)

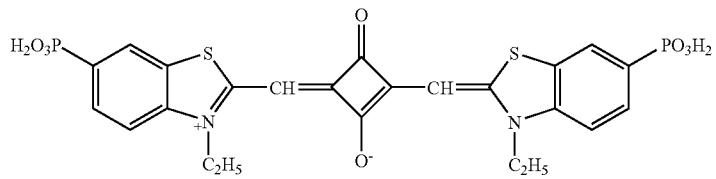 (43)

The compounds of formulae (III) and (IV) can be synthesized in accordance with the methods described, e.g., in F. M. Harmer, *Heterocyclic Compounds-Cyanine Dyes and Related Compounds*, John Wiley & Sons, New York & London (1964); D. M. Sturmer, *Heterocyclic Compounds-Special topics in heterocyclic chemistry*, Ch. 18, §14, Items 482-515, John Wiley & Sons, New York & London (1977); *Rodd's Chemistry of Carbon Compounds*, 2nd Ed., vol. IV, part B, Ch. 15, Items 369-422, Elsevier Science Publishing Co., Inc., New York (1977); and British Patent 1,077,611.

Adsorption of the dye onto semiconductor particles is usually effected by immersing well-dried semiconductor particles in a dye solution for several hours at room temperature or, as taught in JP-A-7-249790, under reflux. Dye adsorption may be carried out either before or after applying the semiconductor particles to the substrate or simultaneously with application of the semiconductor particles. The unadsorbed dye is preferably removed by washing. Where the applied semiconductor particles are to be subjected to calcining, dye adsorption is preferably conducted after the calcining. It is particularly preferred that the dye be adsorbed quickly before water is adsorbed to the surface of the calcined semiconductor layer. The dyes may be used either individually or as a combination of two or more thereof. Where the dye-sensitized photoelectric conversion device is used as a photo-electrochemical cell, the dyes to be combined can be selected so as to maximize the breadth of the wavelength region for photoelectric conversion.

In order to obtain a sufficient sensitizing effect, the dye or dyes are preferably used in an amount of 0.01 to 100 mmol per m$^2$ of the substrate and 0.01 to 1 mmol per gram of the semiconductor particles. With too small an amount of the dye, the sensitizing effect would be insufficient. If the dye is used in too large an amount, the non-adsorbed dye will float to reduce the sensitizing effect.

A colorless compound may be adsorbed together with the dye so as to lessen the interaction among dye molecules, such as association. Hydrophobic compounds such as carboxyl-containing steroid compounds (e.g., cholic acid) can be used for this purpose.

After dye adsorption, the surface of the semiconductor particles can be treated with an amine, such as pyridine or 4-t-butylpyridine. The amine can be used as such where it is liquid, or as dissolved in an organic solvent.

The counter electrode in the photo-electrochemical cell functions as a positive electrode. The counter electrode usually has a conductive substrate, such as those described above, but a substrate is not always required as far as sufficient strength is secured. For achieving air tightness, use of a substrate is advantageous, though.

At least one of the conductive substrate of the semiconductor electrode and the counter electrode must be substantially transparent so that incident light can reach the photosensitive layer. It is preferred for the photo-electrochemical cell of the invention that the conductive substrate of the semiconductor electrode be transparent and that light be incident upon this side. In this case, it is still preferred that the counter electrode have light reflecting properties.

The counter electrode that can be used in the photo-electrochemical cell includes glass or plastic having metal or a conductive oxide deposited thereon. Metal can be deposited by vapor deposition, sputtering or a like technique for thin film formation to obtain a deposit thickness of 5 μm or smaller, preferably 5 nm to 3 μm. A preferred counter electrode is a glass plate having platinum deposited thereon by vapor deposition or a metal thin film formed by vapor deposition or sputtering.

The photosensitive layer may have a single layer structure or a multilayer structure as designed according to the end use. A single photosensitive layer may have a dye of a kind or a mixture of two or more kinds of dyes.

The photo-electrochemical cell of the invention may have its sides sealed with a polymer, an adhesive, etc. to prevent oxidative deterioration.

Preferred embodiments of the present invention are shown below.

(1) A crosslinked polymer obtained by allowing a polyfunctional electrophilic reagent having bi- or higher functionality to react on a nitrogen-containing polymer.

(2) The crosslinked polymer according to (1), wherein the nitrogen-containing polymer is a polymer having a repeating unit represented by formula (I-a).

(3) The crosslinked polymer according to (2), wherein the heterocyclic ring in the heterocyclic group represented by Z in formula (I-a) is a pyridine ring or an imidazole ring.

(4) The crosslinked polymer according to (1), wherein the polyfunctional electrophilic reagent is selected from an alkyl bromide, an alkyl iodide, and a sulfonic ester.

(5) An electrolyte containing the crosslinked polymer according to any of (1) to (4).

(6) The electrolyte according to (5) which further contains an iodine salt and a solvent selected from a carbonic acid ester, a nitrile derivative, and a heterocyclic compound.

(7) The electrolyte according to (5) or (6) which is obtained by allowing a polyfunctional electrophilic reagent to react with a nitrogen-containing polymer in a solvent.
(8) The electrolyte according to (7), wherein the nitrogen-containing polymer is a polymer having a repeating unit represented by formula (I-a).
(9) A photo-electrochemical cell having an electrically conductive substrate, a semiconductor layer that is provided on the substrate, an electrolyte layer, and a counter electrode, wherein the electrolyte layer comprises the electrolyte according to any of (5) to (8).
(10) The photo-electrochemical cell according to (9), wherein the semiconductor is a dye-sensitized particulate semiconductor.

The present invention will now be illustrated in greater detail with reference to Examples, but it should be understood that the invention is not limited thereto.

EXAMPLE 1

1) Preparation of Titanium Dioxide Dispersion

In a 200 ml-volume stainless steel-made vessel having its inner wall coated with Teflon were charged 15 g of titanium dioxide (Degussa P-25, produced by Nippon Aerosil Co., Ltd.), 45 g of water, 1 g of a dispersant (Triton X-100, produced by Aldrich), and 30 g of zirconia beads having a diameter of 0.5 mm (produced by Nikkato Corp.) and dispersed by means of a sand grinder mill (produced by Imex Co., Ltd.) at 1500 rpm for 2 hours. The zirconia beads were filtered off from the dispersion. The average particle size of the dispersed titanium dioxide particles was 2.5 μm as measured with Mastersizer manufactured by Malvern.

2) Preparation of Dye-Sensitized TiO$_2$ Electrode

Electrically conductive glass having an F-doped tin oxide coat (TCO Glass-U, produced by Asahi Glass Co., Ltd.; surface resistivity: about 30 Ω/cm$^2$) was cut to squares with 20 mm-sides. The titanium dioxide dispersion prepared in the above item 1) was applied with a glass bar to the conductive side of 8 glass pieces at a time in the following manner. An adhesive tape was stuck to one end (over a 3 mm width from the edge) of the conductive surface of each glass piece, and 8 glass pieces were aligned in two lines without gap to make a 4 cm wide and 8 cm long strip with their adhesive tape-stuck edges making both sides (8 cm long) of the strip as spacers. The coating weight of the titanium dioxide particles was adjusted to 20 g/m$^2$. After coating, the adhesive tape was removed. The coating layer was air-dried at room temperature for 1 day and then calcined in an electric muffle furnace (Model FP-32, manufactured by Yamato Kagaku) at 450° C. for 30 minutes. After being cooled out of the furnace, the coated glass substrate was immersed in a 3×10$^{-4}$ mol/l ethanol solution of the dye shown in Table 2 below for 3 hours. The amount of the dye coated was selected appropriately from 0.1 to 10 mmol/m$^2$ according to the dye. The dyed glass substrates were immersed in 4-t-butylpyridine for 15 minutes, washed with ethanol, and dried spontaneously. The photosensitive layer (dye-sensitized TiO$_2$ layer) thus formed had a thickness of 10 μM.

3) Preparation of Photo-Electrochemical Cell

A solution containing of the solvent shown in Table 2 below, 0.5 mol/l of the electrolyte salt shown in Table 2, and 0.05 mol/l of iodine was prepared. The N-containing polymer (i.e., the nitrogen-containing polymer) shown in Table 2 was added to the solution in the weight proportion shown to the total amount of the above solution containing the polymer, the solvent, etc. The electrophilic reagent shown in Table 2 was mixed into the solution at the equivalent ratio shown to the mole number of the nitrogen atom of the N-containing polymer to prepare a uniform solution.

As shown in FIG. 1, the dye-sensitized TiO$_2$ electrode prepared in the above item 2) and a Pt-deposited glass substrate (counter electrode) were brought into contact with the TiO$_2$ electrode layer 3 and the Pt deposit layer 6 facing each other. The above-prepared solution was penetrated into the sandwiched TiO$_2$ electrode by making use of osmotic pressure. The impregnated electrode was heated at 80° C. for 30 minutes to induce crosslinking. There were thus obtained photo-electrochemical cells 101 to 164 composed of a conductive glass substrate (glass 1 having a conductor layer 2), a TiO$_2$ electrode 3, a dye layer 4, an electrolyte layer 5, a Pt layer 6, and glass 7 in this order.

Abbreviations used in Table 2 have the following meanings.

TABLE 2

| Cell No. | Dye | N-Containing Polymer (wt %) | Electrophilic Reagent (eq.) | Electrolyte Salt (mol/l) | Iodine (mol/l) | Solvent (wt %) |
|---|---|---|---|---|---|---|
| 101 | R-1 | 1-1 (10) | 2-6 (0.1) | MHIm (0.5) | 0.05 | AN (90) |
| 102 | R-1 | 1-1 (10) | 2-6 (0.2) | MHIm (0.5) | 0.05 | PC (90) |
| 103 | R-1 | 1-1 (10) | 2-7 (0.1) | MHIm (0.5) | 0.05 | DME (90) |
| 104 | R-1 | 1-1 (5) | 2-6 (0.05) | MHIm (0.5) | 0.05 | AN (95) |
| 105 | R-1 | 1-1 (30) | 2-6 (0.1) | MHIm (0.5) | 0.05 | NMO (70) |
| 106 | R-1 | 1-1 (10) | 2-6 (0.1) | MBIm (0.5) | 0.05 | AN (90) |
| 107 | R-1 | 1-1 (10) | 2-6 (0.15) | LiI (0.5) | 0.05 | AN (90) |
| 108 | R-1 | 1-1 (10) | 2.8 (0.05) | MHIm (0.5) | 0.05 | AN (90) |
| 109 | R-1 | 1-1 (7) | 2-10 (0.1) | MHIm (0.5) | 0.05 | AN (93) |
| 110 | R-1 | 1-4 (5) | 2-6 (0.2) | MHIm (0.5) | 0.05 | AN (95) |
| 111 | R-1 | 1-5 (10) | 2-6 (0.2) | MHIm (0.5) | 0.05 | AN (90) |
| 112 | R-1 | 1-5 (10) | 2-6 (0.5) | MBIm (0.5) | 0.05 | AN (90) |
| 113 | R-1 | 1-6 (10) | 2-6 (0.1) | MHIm (0.5) | 0.05 | EC (90) |
| 114 | R-1 | 1-6 (5) | 2-15 (0.3) | MHIm (0.5) | 0.05 | AN (95) |
| 115 | R-1 | 1-1 (10) | 2-6 (0.5) | (C$_3$H$_7$)$_4$NI (0.5) | 0.05 | NMO (90) |
| 116 | R-1 | 1-1 (20) | 2-6 (0.5) | MBIm (0.5) | 0.05 | AN (80) |
| 117 | R-1 | 1-16 (10) | 2-7 (0.5) | MHIm (0.5) | 0.05 | NMO (90) |
| 118 | R-1 | 1-18 (20) | 2-6 (0.2) | MHIm (0.5) | 0.05 | AN (80) |
| 119 | R-13 | 1-1 (10) | 2-6 (0.2) | MHIm (0.5) | 0.05 | AN/NMO = 1/1* (90) |

TABLE 2-continued

| Cell No. | Dye | N-Containing Polymer (wt %) | Electrophilic Reagent (eq.) | Electrolyte Salt (mol/l) | Iodine (mol/l) | Solvent (wt %) |
|---|---|---|---|---|---|---|
| 120 | R-14 | 1-1 (10) | 2-6 (0.2) | MHIm (0.5) | 0.05 | AN (90) |
| 121 | R-16 | 1-1 (10) | 2-6 (0.2) | MBIm (0.5) | 0.05 | AN (90) |
| 122 | R-19 | 1-1 (10) | 2-6 (0.2) | MBIm (0.5) | 0.05 | AN (90) |
| 123 | 1 | 1-1 (10) | 2-6 (0.2) | MBIm (0.5) | 0.05 | AN (90) |
| 124 | 3 | 1-1 (10) | 2-6 (0.2) | MBIm (0.5) | 0.05 | AN (90) |
| 125 | 5 | 1-1 (10) | 2-6 (0.2) | MBIm (0.5) | 0.05 | AN (90) |
| 126 | 26 | 1-1 (10) | 2-6 (0.2) | MBIm (0.5) | 0.05 | AN (90) |
| 127 | 29 | 1-1 (10) | 2-6 (0.2) | MBIm (0.5) | 0.05 | AN (90) |
| 128 | 32 | 1-1 (10) | 2-6 (0.2) | MBIm (0.5) | 0.05 | AN (90) |
| 129 | 37 | 1-1 (10) | 2-6 (0.2) | MBIm (0.5) | 0.05 | AN (90) |
| 130 | 40 | 1-1 (10) | 2-6 (0.2) | MBIm (0.5) | 0.05 | AN (90) |
| 131 | 43 | 1-1 (10) | 2-6 (0.2) | MBIm (0.5) | 0.05 | AN (90) |
| 132 | R-1 | 1-28 (10) | 2-6 (0.2) | MHIm (0.5) | 0.05 | AN (90) |
| 133 | R-1 | 1-28 (10) | 2-6 (0.2) | MHIm (0.5) | 0.05 | PC (90) |
| 134 | R-1 | 1-28 (10) | 2-6 (0.1) | MHIm (0.5) | 0.05 | NMO (70) |
| 135 | R-1 | 1-28 (10) | 2-7 (0.1) | MHIm (0.5) | 0.05 | AN (90) |
| 136 | R-1 | 1-31 (10) | 2-6 (0.5) | MHIm (0.5) | 0.05 | AN (90) |
| 137 | R-1 | 1-34 (10) | 2-6 (0.5) | MHIm (0.5) | 0.05 | AN (90) |
| 138 | R-1 | 1-36 (5) | 2-6 (0.8) | MHIm (0.5) | 0.05 | AN (90) |
| 139 | R-1 | 1-28 (10) | 2-6 (0.1) | MBIm (0.5) | 0.05 | AN (90) |
| 140 | R-1 | 1-28 (10) | 2-6 (0.1) | $(C_3H_7)_4NI$ (0.5) | 0.05 | AN (90) |
| 141 | R-13 | 1-28 (10) | 2-6 (0.1) | MHIm (0.5) | 0.05 | AN (90) |
| 142 | R-16 | 1-28 (10) | 2-6 (0.1) | MHIm (0.5) | 0.05 | AN (90) |
| 143 | 5 | 1-28 (10) | 2-6 (0.1) | MHIm (0.5) | 0.05 | AN (90) |
| 144 | 26 | 1-28 (10) | 2-6 (0.1) | MHIm (0.5) | 0.05 | AN (90) |
| 145 | 29 | 1-28 (10) | 2-6 (0.1) | MHIm (0.5) | 0.05 | AN (90) |
| 146 | 37 | 1-28 (10) | 2-6 (0.1) | MHIm (0.5) | 0.05 | AN (90) |
| 147 | R-1 | 1-4 (10) | 2-24 (0.5) | MHIm (0.5) | 0.05 | AN (90) |
| 148 | R-1 | 1-4 (10) | 2-24 (0.5) | MHIm (0.5) | 0.05 | PC (90) |
| 149 | R-1 | 1-4 (10) | 2-24 (0.5) | MHIm (0.5) | 0.05 | NMO (90) |
| 150 | R-1 | 1-14 (10) | 2-24 (0.5) | MHIm (0.5) | 0.05 | AN (90) |
| 151 | R-1 | 1-28 (10) | 2-24 (0.5) | MHIm (0.5) | 0.05 | AN (90) |
| 152 | R-1 | 1-31 (10) | 2-28 (0.5) | MHIm (0.5) | 0.05 | AN (90) |
| 153 | R-1 | 1-36 (10) | 2-24 (0.5) | MHIm (0.5) | 0.05 | AN (90) |
| 154 | R-1 | 1-4 (10) | 2-30 (0.5) | MBIm (0.5) | 0.05 | AN (90) |
| 155 | R-1 | 1-4 (10) | 2-39 (0.4) | $(C_3H_7)_4NI$ (0.5) | 0.05 | AN (90) |
| 156 | R-1 | 1-18 (10) | 2-33 (0.5) | MHIm (0.5) | 0.05 | AN (90) |
| 157 | R-16 | 1-19 (10) | 2-34 (0.5) | MHIm (0.5) | 0.05 | AN (90) |
| 158 | 5 | 1-4 (10) | 2-35 (0.5) | MHIm (0.5) | 0.05 | AN (90) |
| 159 | 26 | 1-4 (10) | 2-24 (0.5) | MHIm (0.5) | 0.05 | AN (90) |
| 160 | 29 | 1-4 (10) | 2-24 (0.5) | MHIm (0.5) | 0.05 | AN (90) |
| 161 | R-1 | 1-4 (10) | 2-52 (0.5) | MHIm (0.5) | 0.05 | AN (90) |
| 162 | R-1 | 1-4 (10) | 2-53 (0.5) | MHIm (0.5) | 0.05 | AN (90) |
| 163 | R-1 | 1-4 (10) | 2-55 (0.5) | MHIm (0.5) | 0.05 | AN (90) |
| 164 | 37 | 1-4 (10) | 2-24 (0.5) | MHIm (0.5) | 0.05 | AN (90) |

NMO: 3-methyl-2-oxazolidinone
PC: propylene carbonate
EC: ethylene carbonate
DME: dimethoxyethane
AN: acetonitrile
MHIm: iodine salt of 1-methyl-3-hexylimidazolium
MBIm: iodine salt of 1-methyl-3-butylimidazolium 4) Preparation of Comparative Photo-Electrochemical Cells
Comparative Cell A:

A dye-sensitized $TiO_2$ electrode (2 cm by 2 cm) prepared in the same manner as described above and a Pt-deposited glass substrate (counter electrode) of the same size (2 cm×2 cm) were brought into contact with each other as shown in FIG. 1. An electrolytic solution of 0.05 mol/l of iodine and 0.5 mol/l of lithium iodide in a 90/10 (by volume) mixture of acetonitrile and 3-methyl-2-oxazolidinone was penetrated into the sandwiched $TiO_2$ electrode by making use of capillarity to obtain a comparative cell A. Comparative cell B (electrolyte of JP-A-9-27352):

One gram of hexamethylene glycol methacrylate (Blenmer PE-350, produced by Nippon Yushi Kagaku K.K.), 1 g of ethylene glycol, and 20 mg of 2-hydroxy-2-methyl-1-phenyl-propan-1-one (Darocua 1173, a polymerization initiator produced by Chiba-Geigy (Japan) Ltd.) were mixed, and 500 mg of lithium iodide was dissolved therein. After degassing in vacuo for 10 minutes, the mixture was applied to a dye-sensitized $TiO_2$ electrode (2 cm by 2 cm) prepared in the same manner as described above. The coated electrode was placed under reduced pressure to promote penetration of the coating mixture into the porous electrode in place of air bubbles. The electrode was irradiated with ultraviolet light to induce polymerization to form uniform polymer gel in the pores of the electrode layer. The electrode was exposed to an iodine atmosphere for 30 minutes to let iodine diffuse in the polymer to obtain a comparative cell B.

5) Measurement of Photoelectric Conversion Efficiency

The photoelectric conversion efficiency (characteristics) of the photo-electrochemical cells prepared in Example 1 were evaluated as follows.

The conductive glass 1 and the Pt-deposited glass 7 were connected by means of alligator clips, and the cell was irradiated with pseudo-sunlight containing no ultraviolet rays having an intensity of 86 mW/cm$^2$ which was obtained by cutting light from a 500 W xenon lamp (produced by Ushio Inc.) through AM1.5 Filter (produced by Oriel) and a sharp cut filter (Kenko L-42). The generated electricity was measured with a current-voltage meter (Keithly Model SMU238) to obtain an open circuit voltage ($V_{oc}$), a short circuit current density ($J_{sc}$), a fill factor (FF), and a conversion efficiency ($\eta$). After 360-hour continuous irradiation, the short circuit current density was again measured to obtain a rate of a reduction. The results obtained are shown in Table 3 below.

TABLE 3

| Cell No. | $J_{sc}$ (mA/cm$^2$) | $V_{oc}$ (V) | FF | $\eta$ (%) | $J_{sc}$ after 360 hrs (mA/cm$^2$) | $J_{sc}$ Reduction (%) |
|---|---|---|---|---|---|---|
| 101 | 6.12 | 0.65 | 0.43 | 2.01 | 3 | 51 |
| 102 | 6.41 | 0.66 | 0.37 | 1.80 | 3.87 | 40 |
| 103 | 6.23 | 0.59 | 0.33 | 1.42 | 3.12 | 50 |
| 104 | 6.12 | 0.57 | 0.43 | 1.73 | 3.7 | 40 |
| 105 | 5.85 | 0.67 | 0.33 | 1.51 | 2.93 | 50 |
| 106 | 7.22 | 0.68 | 0.33 | 1.87 | 3.98 | 45 |
| 107 | 5.15 | 0.48 | 0.61 | 1.76 | 2.77 | 46 |
| 108 | 5.22 | 0.55 | 0.63 | 2.10 | 2.72 | 48 |
| 109 | 5.73 | 0.47 | 0.77 | 2.41 | 2.85 | 50 |
| 110 | 6.22 | 0.68 | 0.42 | 2.07 | 3.29 | 47 |
| 111 | 6.14 | 0.65 | 0.38 | 1.78 | 2.47 | 60 |
| 112 | 6.75 | 0.69 | 0.33 | 1.77 | 3.64 | 46 |
| 113 | 6.12 | 0.61 | 0.43 | 1.87 | 3.57 | 42 |
| 114 | 6.54 | 0.77 | 0.29 | 1.67 | 3.45 | 47 |
| 115 | 6.41 | 0.65 | 0.37 | 1.81 | 3.75 | 41 |
| 116 | 5.77 | 0.65 | 0.33 | 1.44 | 2.61 | 55 |
| 117 | 7.61 | 0.71 | 0.29 | 1.79 | 4.43 | 42 |
| 118 | 6.03 | 0.65 | 0.41 | 1.87 | 3.24 | 46 |
| 119 | 4.32 | 0.65 | 0.55 | 1.80 | 2.39 | 45 |
| 120 | 3.33 | 0.66 | 0.56 | 1.44 | 1.73 | 48 |
| 121 | 4.96 | 0.68 | 0.39 | 1.55 | 2.53 | 49 |
| 122 | 4.94 | 0.64 | 0.46 | 1.70 | 2.61 | 47 |
| 123 | 4.49 | 0.65 | 0.46 | 1.57 | 2.35 | 48 |
| 124 | 3.46 | 0.62 | 0.57 | 1.43 | 1.73 | 50 |
| 125 | 4.38 | 0.67 | 0.41 | 1.41 | 2.06 | 53 |
| 126 | 3.56 | 0.66 | 0.43 | 1.16 | 1.71 | 52 |
| 127 | 5.02 | 0.67 | 0.51 | 1.98 | 2.6 | 48 |
| 128 | 4.88 | 0.67 | 0.48 | 1.81 | 2.59 | 47 |
| 129 | 4.33 | 0.66 | 0.50 | 1.66 | 2.29 | 47 |
| 130 | 5.21 | 0.68 | 0.47 | 1.92 | 2.84 | 45 |
| 131 | 5.02 | 0.65 | 0.51 | 1.92 | 2.65 | 47 |
| 132 | 7.52 | 0.65 | 0.50 | 2.84 | 3.91 | 48 |
| 133 | 7.41 | 0.64 | 0.47 | 2.59 | 4.00 | 46 |
| 134 | 7.25 | 0.65 | 0.45 | 2.47 | 4.21 | 42 |
| 135 | 7.41 | 0.65 | 0.49 | 2.74 | 3.93 | 47 |
| 136 | 7.40 | 0.63 | 0.49 | 2.66 | 3.85 | 48 |
| 137 | 7.38 | 0.62 | 0.51 | 2.71 | 4.28 | 42 |
| 138 | 7.14 | 0.65 | 0.58 | 3.13 | 3.64 | 49 |
| 139 | 7.83 | 0.62 | 0.52 | 2.94 | 3.92 | 50 |
| 140 | 7.38 | 0.65 | 0.44 | 2.45 | 4.21 | 43 |
| 141 | 6.22 | 0.64 | 0.51 | 2.36 | 3.30 | 47 |
| 142 | 6.11 | 0.66 | 0.47 | 2.20 | 3.42 | 44 |
| 143 | 5.22 | 0.66 | 0.47 | 1.88 | 3.03 | 42 |
| 144 | 5.21 | 0.67 | 0.47 | 1.91 | 2.76 | 47 |
| 145 | 5.57 | 0.65 | 0.51 | 2.15 | 3.01 | 46 |
| 146 | 5.22 | 0.66 | 0.52 | 2.08 | 2.71 | 48 |
| 147 | 8.42 | 0.65 | 0.55 | 3.50 | 4.55 | 46 |
| 148 | 7.93 | 0.65 | 0.53 | 3.18 | 4.45 | 44 |
| 149 | 8.02 | 0.65 | 0.54 | 3.27 | 4.65 | 42 |
| 150 | 8.33 | 0.64 | 0.54 | 3.35 | 4.41 | 47 |
| 151 | 8.39 | 0.65 | 0.53 | 3.36 | 4.53 | 46 |
| 152 | 8.28 | 0.63 | 0.53 | 3.21 | 4.73 | 43 |
| 153 | 8.4 | 0.64 | 0.53 | 3.31 | 4.45 | 47 |

TABLE 3-continued

| Cell No. | $J_{sc}$ (mA/cm$^2$) | $V_{oc}$ (V) | FF | $\eta$ (%) | $J_{sc}$ after 360 hrs (mA/cm$^2$) | $J_{sc}$ Reduction (%) |
|---|---|---|---|---|---|---|
| 154 | 8.11 | 0.63 | 0.54 | 3.21 | 4.22 | 48 |
| 155 | 8.23 | 0.64 | 0.53 | 3.25 | 4.86 | 41 |
| 156 | 8.09 | 0.65 | 0.54 | 3.30 | 4.53 | 44 |
| 157 | 6.33 | 0.66 | 0.5 | 2.43 | 3.67 | 42 |
| 158 | 5.35 | 0.67 | 0.52 | 2.17 | 3.10 | 42 |
| 159 | 5.58 | 0.67 | 0.51 | 2.22 | 3.07 | 45 |
| 160 | 5.98 | 0.66 | 0.56 | 2.57 | 3.41 | 43 |
| 161 | 8.22 | 0.64 | 0.55 | 3.36 | 4.52 | 45 |
| 162 | 8.08 | 0.64 | 0.52 | 3.13 | 4.52 | 44 |
| 163 | 8.13 | 0.65 | 0.54 | 3.32 | 4.47 | 45 |
| 164 | 5.64 | 0.66 | 0.56 | 2.42 | 3.05 | 46 |
| A | 9.9 | 0.6 | 0.43 | 2.97 | 0.21 | 98 |
| B | 1.53 | 0.35 | 0.5 | 0.31 | 0.43 | 72 |

It is apparent from the results of Table 3 that the photo-electrochemical cells according to the invention are less liable to undergo deterioration in photoelectric conversion characteristics as compared with the comparative cell A and exhibit more excellent photoelectric conversion characteristics, having a larger short circuit current density, as compared with the comparative cell B.

EXAMPLE 2

1) Preparation of Dye-Sensitized TiO$_2$ Electrode

A TiO$_2$ electrode having adsorbed thereto the dye shown in Table 4 below was prepared in the same manner as in Example 1.

2) Preparation of Photo-Electrochemical Cell

A solution containing the solvent shown in Table 4, 0.5 mol/l of the electrolyte salt shown in Table 4, and 0.05 mol/l of iodine was prepared. To the solution was added the N-containing polymer (i.e., the nitrogen-containing polymer) shown in Table 4 in a weight proportion shown to the total amount of the above solution containing the polymer, the solvent, etc. The electrophilic reagent shown in Table 4 was mixed into the solution at the equivalent ratio shown to the mole number of the nitrogen atom of the N-containing polymer to prepare a uniform solution.

As shown in FIG. 1, the dye-sensitized TiO$_2$ electrode prepared in the above item 1) and a Pt-deposited glass substrate (counter electrode) were brought into contact with the TiO$_2$ electrode layer 3 and the Pt deposit layer 6 facing each other. The above-prepared solution was penetrated into the sandwiched TiO$_2$ electrode by making use of osmotic pressure. The impregnated electrode was heated at 80° C. for 30 minutes to induce crosslinking. There were thus obtained photo-electrochemical cells 201 to 231.

3) Evaluation of Photoelectric Conversion Efficiency

The photoelectric conversion efficiency (characteristics) of the photo-electrochemical cells prepared in Example 2 were evaluated in the same manner as in Example 1, except that a reduction in short circuit current density ($J_{sc}$) was obtained from the $J_{sc}$ after 480-hour continuous irradiation. The results obtained are shown in Table 5 below.

TABLE 4

| Cell No. | Dye | Solvent (wt %) | N-Containing Polymer (wt %) | Electrophilic Reagent (eq.) | Electrolyte Salt (mol/l) | Iodine Concn. (mol/l) |
|---|---|---|---|---|---|---|
| 201 | R-1 | S-2 (90) | 1-1 (10) | 2-6 (0.1) | MHIm (0.5) | 0.05 |
| 202 | R-1 | S-11 (90) | 1-1 (10) | 2-6 (0.2) | MHIm (0.5) | 0.05 |
| 203 | R-1 | S-11 (90) | 1-1 (10) | 2-7 (0.1) | MHIm (0.5) | 0.05 |
| 204 | R-1 | S-11 (95) | 1-1 (5) | 2-6 (0.05) | MHIm (0.5) | 0.05 |
| 205 | R-1 | S-11 (70) | 1-1 (30) | 2-6 (0.1) | MHIm (0.5) | 0.05 |
| 206 | R-1 | S-2 (90) | 1-1 (10) | 2-6 (0.1) | MBIm (0.5) | 0.05 |
| 207 | R-1 | S-2 (90) | 1-1 (10) | 2-6 (0.15) | LiI (0.5) | 0.05 |
| 208 | R-1 | S-2 (90) | 1-1 (10) | 2-8 (0.05) | MHIm (0.5) | 0.05 |
| 209 | R-1 | S-2 (93) | 1-1 (7) | 2-10 (0.1) | MHIm (0.5) | 0.05 |
| 210 | R-1 | S-11 (95) | 1-4 (5) | 2-6 (0.2) | MHIm (0.5) | 0.05 |
| 211 | R-1 | S-11 (90) | 1-5 (10) | 2-6 (0.2) | MHIm (0.5) | 0.05 |
| 212 | R-1 | S-11 (90) | 1-5 (10) | 2-6 (0.5) | MBIm (0.5) | 0.05 |
| 213 | R-1 | S-11 (90) | 1-6 (10) | 2-6 (0.1) | MHIm (0.5) | 0.05 |
| 214 | R-1 | S-2 (95) | 1-6 (5) | 2-15 (0.3) | MHIm (0.5) | 0.05 |
| 215 | R-1 | S-11 (90) | 1-1 (10) | 2-6 (0.5) | $(C_3H_7)_4NI$ (0.5) | 0.05 |
| 216 | R-1 | S-2 (80) | 1-1 (20) | 2-6 (0.5) | MBIm (0.5) | 0.05 |
| 217 | R-1 | S-11 (90) | 1-16 (10) | 2-7 (0.5) | MHIm (0.5) | 0.05 |
| 218 | R-1 | S-14 (80) | 1-18 (20) | 2-6 (0.2) | MHIm (0.5) | 0.05 |
| 219 | R-13 | S-2/S-11 = 1/1 (by vol.) (90) | 1-1 (10) | 2-6 (0.2) | MHIm (0.5) | 0.05 |
| 220 | R-14 | S-11 (90) | 1-1 (10) | 2-6 (0.2) | MHIm (0.5) | 0.05 |
| 221 | R-16 | S-2 (90) | 1-1 (10) | 2-6 (0.2) | MBIm (0.5) | 0.05 |
| 222 | R-19 | S-2 (90) | 1-1 (10) | 2-6 (0.2) | MBIm (0.5) | 0.05 |
| 223 | 1 | S-11 (90) | 1-1 (10) | 2-6 (0.2) | MBIm (0.5) | 0.05 |
| 224 | 3 | S-11 (90) | 1-1 (10) | 2-6 (0.2) | MBIm (0.5) | 0.05 |
| 225 | 5 | S-11 (90) | 1-1 (10) | 2-6 (0.2) | MBIm (0.5) | 0.05 |
| 226 | 26 | S-11 (90) | 1-1 (10) | 2-6 (0.2) | MBIm (0.5) | 0.05 |
| 227 | 29 | S-11 (90) | 1-1 (10) | 2-6 (0.2) | MBIm (0.5) | 0.05 |
| 228 | 32 | S-2 (90) | 1-1 (10) | 2-6 (0.2) | MBIm (0.5) | 0.05 |
| 229 | 37 | S-11 (90) | 1-1 (10) | 2-6 (0.2) | MBIm (0.5) | 0.05 |
| 230 | 40 | S-11 (90) | 1-1 (10) | 2-6 (0.2) | MBIm (0.5) | 0.05 |
| 231 | 43 | S-2 (90) | 1-1 (10) | 2-6 (0.2) | MBIm (0.5) | 0.05 |

TABLE 5

| Cell No. | $J_{sc}$ (mA/cm$^2$) | $V_{oc}$ (V) | FF | $\eta$ (%) | $J_{sc}$ after 480 hrs (mA/cm$^2$) | $J_{sc}$ Reduction (%) |
|---|---|---|---|---|---|---|
| 201 | 6.02 | 0.64 | 0.45 | 2.02 | 4.33 | 29 |
| 202 | 6.37 | 0.64 | 0.46 | 2.18 | 4.33 | 32 |
| 203 | 6.2 | 0.61 | 0.41 | 1.80 | 4.22 | 32 |
| 204 | 6.02 | 0.6 | 0.48 | 2.02 | 4.21 | 30 |
| 205 | 5.81 | 0.65 | 0.46 | 2.02 | 4.01 | 31 |
| 206 | 6.99 | 0.66 | 0.38 | 2.04 | 4.75 | 32 |
| 207 | 5.13 | 0.51 | 0.65 | 1.98 | 3.33 | 35 |
| 208 | 5.22 | 0.55 | 0.63 | 2.10 | 3.60 | 31 |
| 209 | 5.7 | 0.49 | 0.66 | 2.14 | 3.93 | 31 |
| 210 | 6.19 | 0.65 | 0.43 | 2.01 | 4.21 | 32 |
| 211 | 6.12 | 0.63 | 0.40 | 1.79 | 4.22 | 31 |
| 212 | 6.65 | 0.66 | 0.36 | 1.84 | 4.52 | 32 |
| 213 | 6.11 | 0.62 | 0.42 | 1.85 | 4.70 | 23 |
| 214 | 6.55 | 0.770 | 0.29 | 1.68 | 4.45 | 32 |
| 215 | 6.40 | 0.630 | 0.38 | 1.78 | 4.35 | 32 |
| 216 | 5.63 | 0.660 | 0.35 | 1.51 | 3.49 | 38 |
| 217 | 7.55 | 0.670 | 0.31 | 1.82 | 5.51 | 27 |
| 218 | 5.99 | 0.660 | 0.40 | 1.84 | 4.55 | 24 |
| 219 | 4.30 | 0.660 | 0.53 | 1.75 | 3.01 | 30 |
| 220 | 3.31 | 0.650 | 0.60 | 1.50 | 2.42 | 27 |
| 221 | 4.93 | 0.670 | 0.45 | 1.73 | 3.60 | 27 |
| 222 | 4.93 | 0.650 | 0.46 | 1.72 | 3.80 | 23 |
| 223 | 4.46 | 0.660 | 0.45 | 1.54 | 3.26 | 27 |
| 224 | 3.44 | 0.640 | 0.55 | 1.41 | 2.55 | 26 |
| 225 | 4.36 | 0.64 | 0.48 | 1.56 | 3.05 | 30 |
| 226 | 3.48 | 0.67 | 0.55 | 1.49 | 2.54 | 27 |
| 227 | 4.97 | 0.66 | 0.51 | 1.95 | 3.53 | 29 |
| 228 | 4.76 | 0.65 | 0.47 | 1.69 | 3.38 | 29 |
| 229 | 4.31 | 0.67 | 0.53 | 1.78 | 3.02 | 30 |
| 230 | 5.11 | 0.65 | 0.49 | 1.89 | 3.53 | 31 |
| 231 | 4.96 | 0.66 | 0.49 | 1.87 | 3.52 | 29 |

While the invention has been described in detail and with reference to specific examples thereof, it will be apparent to one skilled in the art that various changes and modifications can be made therein without departing from the spirit and scope thereof.

What is claimed is:

1. A method for preparing a cross-linked polymer in an electrolyte composition comprising a liquid electrolyte and a cross-linked polymer comprising:

reacting a nitrogen-containing polymer compound containing a nitrogen atom to be quaternized with an electrophilic reagent having at least two groups that react with the nitrogen-containing polymer compound so as to obtain the cross-linked polymer and forming the electrolyte composition containing the cross-linked polymer and a liquid electrolyte comprised of a salt and a solvent for the salt having high ion conductivity, wherein the nitrogen-containing polymer compound is a polymer having a repeating unit represented by formula (1-a)

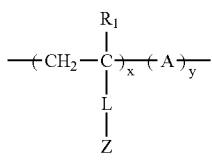

(I-a)

wherein $R_1$ represents a hydrogen atom or an alkyl group having 1 to 4 carbon atoms; Z represents a nitrogen-containing heterocyclic group containing a nitrogen atom to be quaternized; L represents a direct bond or a divalent linking group; A represents a repeating unit formed by 1) esters derived from acrylic acid or α-alkylacrylic acid, or 2) amides derived from acrylic acid or α-alkylacrylic acid, or 3) aromatic vinyl compounds; and x and y each represent a molar ratio of the respective repeating units, x being 10 to 95 mol %, and y being 5 to 90 mol %.

2. The method for preparing a crosslinked polymer in an electrolyte composition comprising a liquid electrolyte and a cross-linked polymer as in claim 1, wherein the heterocyclic ring in said heterocyclic group represented by Z is a pyridine ring or an imidazole ring.

3. The method for preparing a crosslinked polymer in an electrolyte composition comprising a liquid electrolyte and a cross-linked polymer as in claim 1, wherein the electrophilic reagent is represented by formula (I-b):

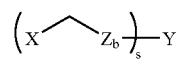

(I-b)

wherein X represents a releasing group; Y represents a direct bond or an s-valent linking group; s represents an integer of 2 to 4; $Z_b$ represents a direct bond or a divalent linking group.

4. The method for preparing a cross-linked polymer in an electrolyte composition comprising a liquid electrolyte and a cross-linked polymer as in claim 3, wherein X represents at least one selected from the group consisting of a halogen atom, an alkylcarbonyloxy group, an arylcarbonyloxy group, an aralkylsulfonyloxy group and an arylsulfonyloxy group, and $Z_b$ represents a direct bond or at least one selected from the group consisting of —CO—, —COO—, —SO—, —$SO_2$— and a phenylene group.

\* \* \* \* \*